United States Patent
Kubov et al.

(10) Patent No.: US 12,147,396 B2
(45) Date of Patent: Nov. 19, 2024

(54) SYSTEM AND METHOD FOR DATA COMPRESSION AND DECOMPRESSION

(71) Applicant: Avast Software s.r.o., Prague (CZ)

(72) Inventors: Peter Kubov, Madunice (SK); Peter Matula, Brno (CZ)

(73) Assignee: Avast Software s.r.o., Prague (CZ)

( * ) Notice: Subject to any disclaimer, the term of this patent is extended or adjusted under 35 U.S.C. 154(b) by 23 days.

(21) Appl. No.: 17/569,071

(22) Filed: Jan. 5, 2022

(65) Prior Publication Data
US 2023/0214367 A1 Jul. 6, 2023

(51) Int. Cl.
*G06F 16/21* (2019.01)
*H03M 7/30* (2006.01)

(52) U.S. Cl.
CPC ............ *G06F 16/211* (2019.01); *H03M 7/30* (2013.01)

(58) Field of Classification Search
CPC .. G06F 16/211; G06F 3/0638; G06F 16/2282; H03M 7/00; H03M 7/30
USPC ......................................................... 707/693
See application file for complete search history.

(56) References Cited

U.S. PATENT DOCUMENTS

| | | | | |
|---|---|---|---|---|
| 11,115,049 B1* | 9/2021 | Chang | ................... | H03M 7/40 |
| 2003/0158850 A1* | 8/2003 | Lawrence | ............. | G06F 16/313 |
| | | | | 707/E17.084 |
| 2014/0108364 A1* | 4/2014 | Dani | .................... | G06F 16/1744 |
| | | | | 707/693 |
| 2017/0147674 A1* | 5/2017 | Procops | ................ | G06F 16/285 |
| 2019/0140657 A1* | 5/2019 | Suzuki | .................... | H03M 7/40 |
| 2020/0057818 A1* | 2/2020 | Kim | ........................ | G06F 16/221 |
| 2020/0226149 A1* | 7/2020 | Iqbal | ..................... | G06F 16/278 |

OTHER PUBLICATIONS

Data compression ratio, Wikipedia, https://wikipedia.org/wiki/Data_compression_ratio, accessed Nov. 10, 2021.
lemire/EWAHBoolArray: A compresed bitmap class in C++, GitHub, https://github.com/lemire/EWAHBoolArray, accessed Nov. 10, 2021.
RoaringBitmap/roaring: Roaring bitmaps in Go (golang), GitHub, https://github.com/RoaringBitmap/roaring, accessed Nov. 10, 2021.
Hash function, Wikipedia, https://en.wikipedia.org/wiki/Hash_function, accessed Nov. 10, 2021.

* cited by examiner

*Primary Examiner* — Brittany N Allen
*Assistant Examiner* — William P Bartlett
(74) *Attorney, Agent, or Firm* — Dovas Law, P.C.

(57) ABSTRACT

A data processing method in the form of a data compression method is provided in which a plurality of integers are accessed. Each of the plurality of integers is split to generate a first plurality of numbers respectively paired with a second plurality of numbers. A first tuple is generated based on the first plurality of numbers. A second tuple is generated based on the second plurality of numbers and the first plurality of numbers. The first tuple and the second tuple are stored. A system and computer readable medium enabling the data processing method are further provided.

21 Claims, 16 Drawing Sheets

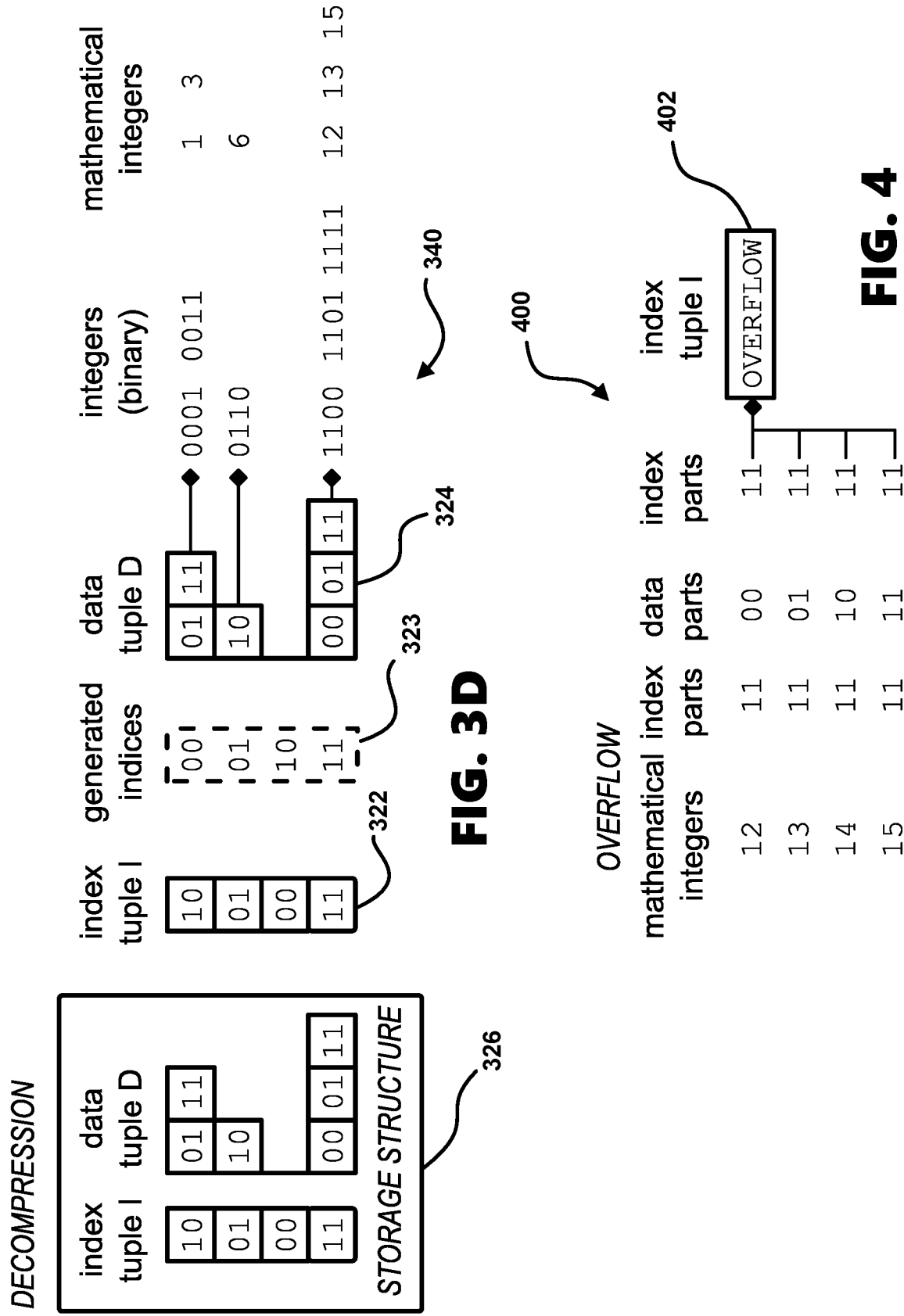

SYSTEM AND METHOD FOR DATA COMPRESSION AND DECOMPRESSION

FIELD OF INVENTION

The invention relates generally to data processing, and more particularly to data compression and decompression.

BACKGROUND

Hashing involves the use of various hash functions and finds many applications across the information technology industry. Computing security companies in particular are among the heaviest users of hashing technologies. Hash values, the values returned by a hash function, are typically uniformly distributed across the hash function's output range. Hash values across the hash function's output range are generated with approximately the same probability and therefore appear random.

Oftentimes it is necessary to store and query enormous amounts of hash values or values aggregated or generated in other manners. Being able to do so efficiently, quickly and at a low resource cost, is vitally important to the functioning and usability of a computing system. A challenge arises in that lossless compression of random data has been regarded as mathematically impossible. It is however possible to compress random data under certain conditions. Algorithms specialized for integer number compression exist. However, large value universes or sparse or random values are likely to require computer memory usage beyond the raw size of the original data when implementing known compression algorithms.

SUMMARY

This Summary introduces simplified concepts that are further described below in the Detailed Description of Illustrative Embodiments. This Summary is not intended to identify key features or essential features of the claimed subject matter and is not intended to be used to limit the scope of the claimed subject matter.

A data processing method in the form of a data compression method is provided in which a plurality of integers are accessed. Each of the plurality of integers is split to generate a first plurality of numbers respectively paired with a second plurality of numbers. A first tuple is generated based on the first plurality of numbers. A second tuple is generated based on the second plurality of numbers and the first plurality of numbers. The first tuple and the second tuple are stored.

Further provided is a system including one or more processors and memory storing executable instructions that, as a result of being executed, cause the system to perform operations. The operations include accessing a plurality of integers, splitting each of the plurality of integers to generate a first plurality of numbers respectively paired with a second plurality of numbers, and generating a first tuple based on the first plurality of numbers. The operations further include generating a second tuple based on the second plurality of numbers and the first plurality of numbers and storing the first tuple and the second tuple.

Further provided is a non-transitory computer-readable storage medium storing executable instructions that, as a result of execution by one or more processors of a computer system, cause the computer system to perform operations. The operations include accessing a plurality of integers, splitting each of the plurality of integers to generate a first plurality of numbers respectively paired with a second plurality of numbers, and generating a first tuple based on the first plurality of numbers. The operations further include generating a second tuple based on the second plurality of numbers and the first plurality of numbers and storing the first tuple and the second tuple.

BRIEF DESCRIPTION OF THE DRAWING(S)

A more detailed understanding may be had from the following description, given by way of example with the accompanying drawings. The Figures in the drawings and the detailed description are examples. The Figures and the detailed description are not to be considered limiting and other examples are possible. Like reference numerals in the Figures indicate like elements wherein:

FIGS. 3A-3D are diagrams showing an exemplary implementation of the storage structure of FIG. 2.

FIG. 4 is a diagram showing another exemplary implementation of the storage structure of FIG. 2, which implementation results in an overflow.

DETAILED DESCRIPTION OF ILLUSTRATIVE EMBODIMENT(S)

An "integer" as described herein is a datum of integral data type, a data type that represents a subset of mathematical integers. Integers described herein are represented as a string of bits using the binary numeral system. Given a set M of K integers, each of B bits, their uncompressed size is K*B bits. For example, it would take 640 gigabits (Gb) of storage to store 10 billion 64-bit integers.

Described herein is a storage structure for integers that reduces the required amount of computer memory required. The herein described storage structure functions most effectively for integers relatively uniformly (i.e., randomly) distributed over their value space, that enough integers are stored, and that not too many integers are stored. In a particular implementation, an entire value space is split into blocks starting at regular intervals. Then, instead of storing all the integers' bits, bits offsetting integers within the blocks are stored, and all the block sizes are stored.

Figure 1A:
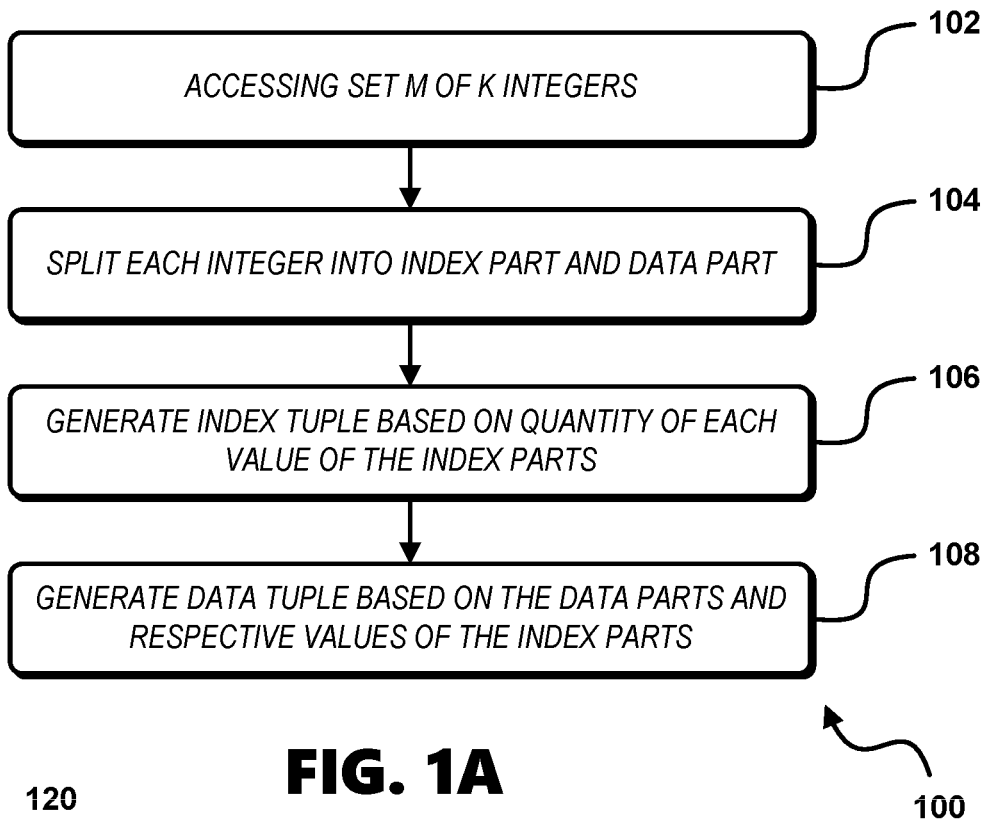
FIG. 1A is a diagram showing a data compression method.
Figure 1B:
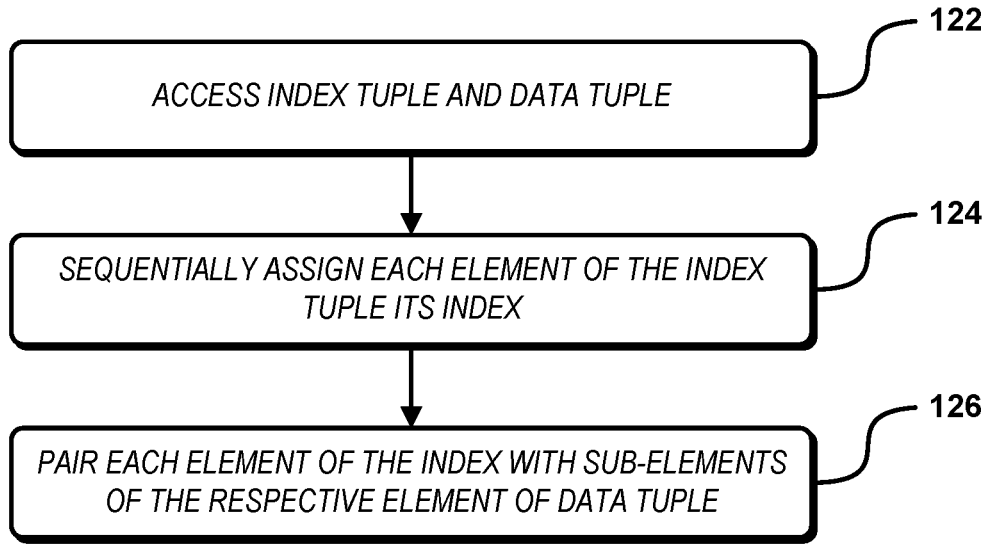
FIG. 1B is a diagram showing a data decompression method continuing from the data compression method of FIG. 1A.

Referring to FIGS. 1A and 1B, diagrams show a data compression method 100 and a data decompression method 120. The steps of the methods 100, 120 can be performed for example via instructions 2024 executable by a computer system 2000 as described with reference to FIG. 15. Alternatively, the methods 100, 120 can be performed via other components in other environments and are not restricted to being implemented by the described components.

In a step 102 of the method 100, a set M of K integers (the set cardinality |M|=K) is accessed. Each integer is of a bit size B. The total size S of the set M is K*B, that is that S=K*B. Beneficially, the set M of K integers is sorted. Alternatively, unsorted integers can be accessed.

Each integer in the set M of size B is split into a first part and a second part, the first part being an index part of size $B_A$, and the second part being a data part of size $B_D$ (step 104). The combined bit size of an index part and a data part make up the bit size B of an integer in the set M, that is $B=B_A+B_D$. The index part size $B_A$ can be equal to or unequal to the data part size $B_D$.

A block index tuple I is generated based on a quantity of each value of the index parts (step 106). The block index tuple I is generated from the index parts by counting the incidences of all possible values of the index parts, defined by $B_A$ as a range <0, 1, . . . , $2^{B_A}$−1). The number of elements in the index parts block index tuple I is therefore $2^{B_A}$.

A block data tuple D is generated based on the data parts and the respective values of the index parts (step 108). The block data tuple D is generated as a tuple of sub-tuples of quantity equal to $2^{B_A}$. Each sub-tuple includes one or more sorted data parts of those integers which corresponding index part was counted into a respective element of the block index tuple I or includes a null value for those integers for which a corresponding index part is not present (i.e., zero quantity). The number of sub-tuples ("elements") in D is therefore again $2^{B_A}$. The total number of sub-elements in the sub-tuples is K (one for each integer).

Figure 2:
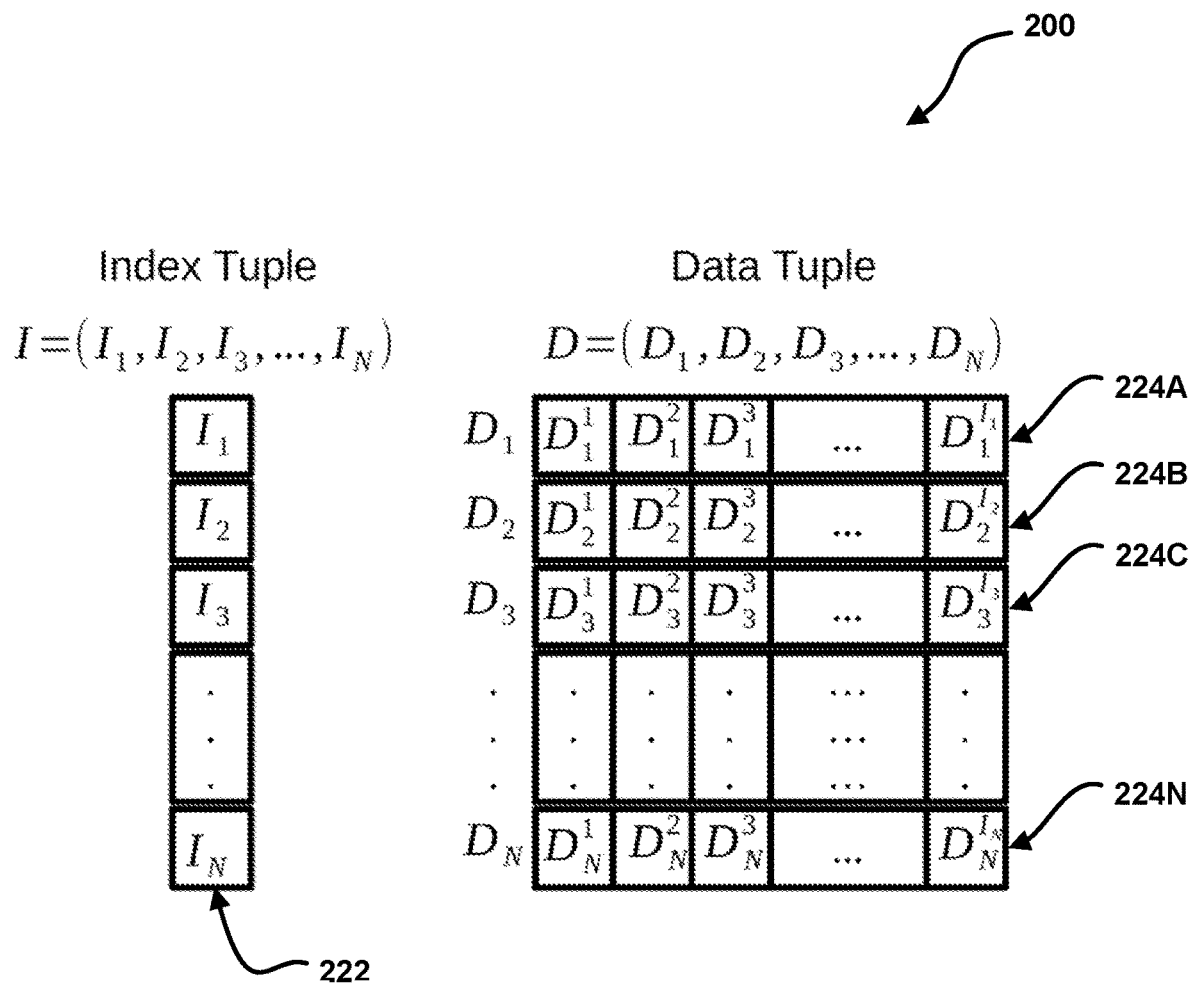
FIG. 2 shows a storage structure for storing an index tuple and a data tuple for use in a data compression method and a data decompression method.
Figure 3A:
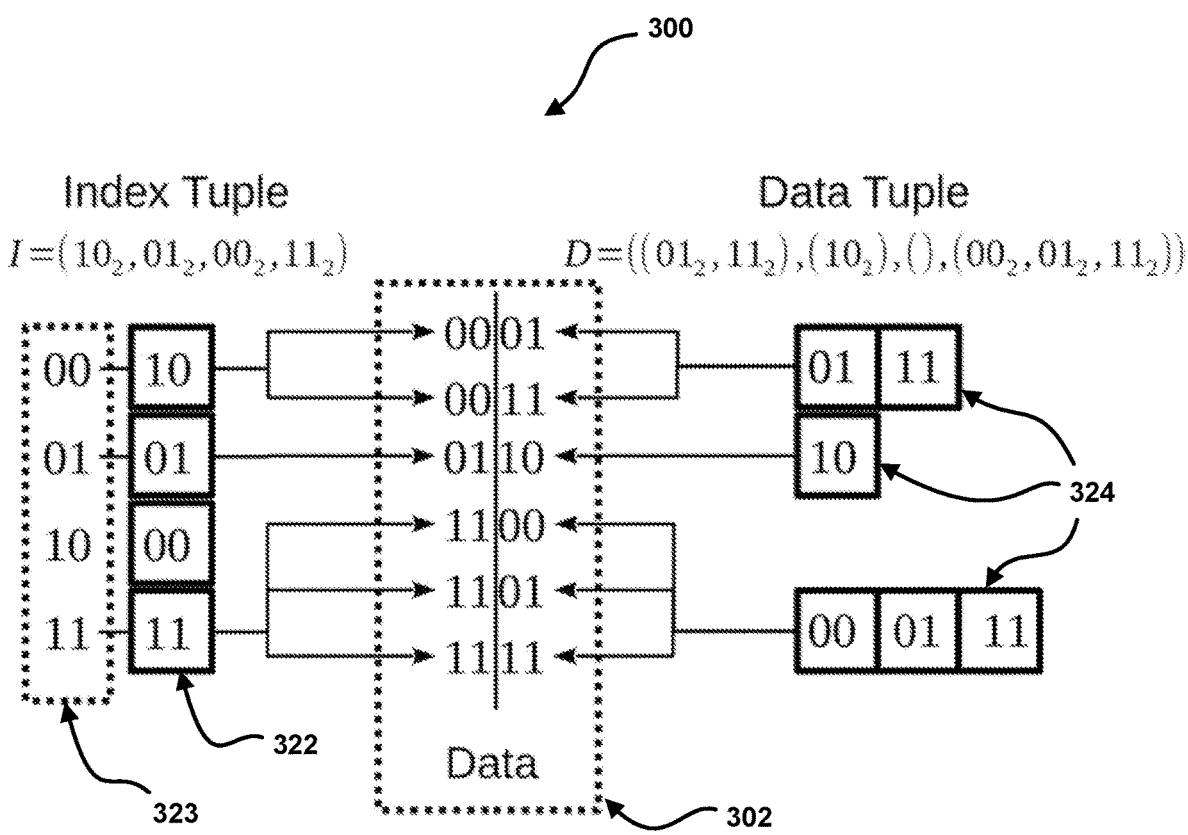
Figure 3B:
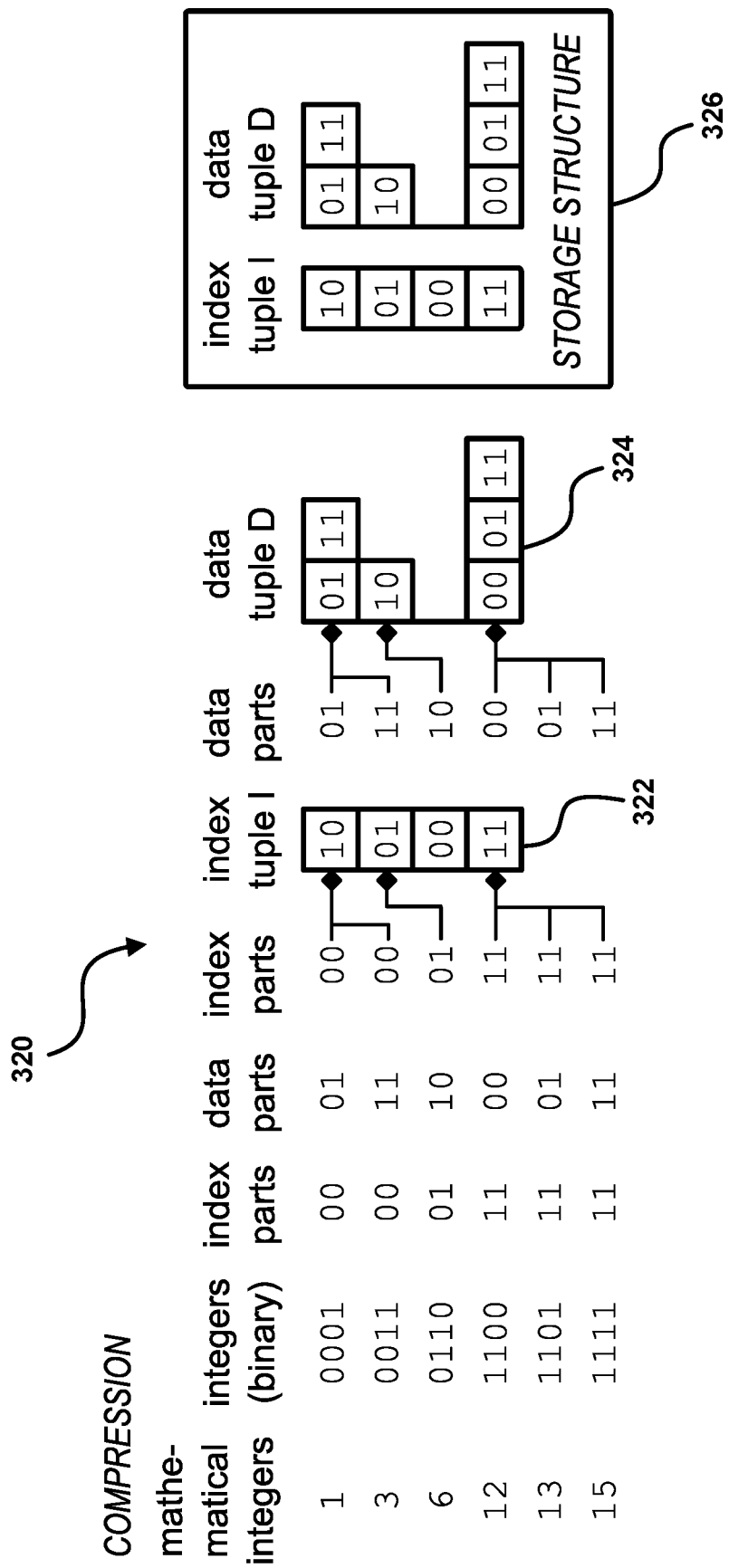
Figure 3C:
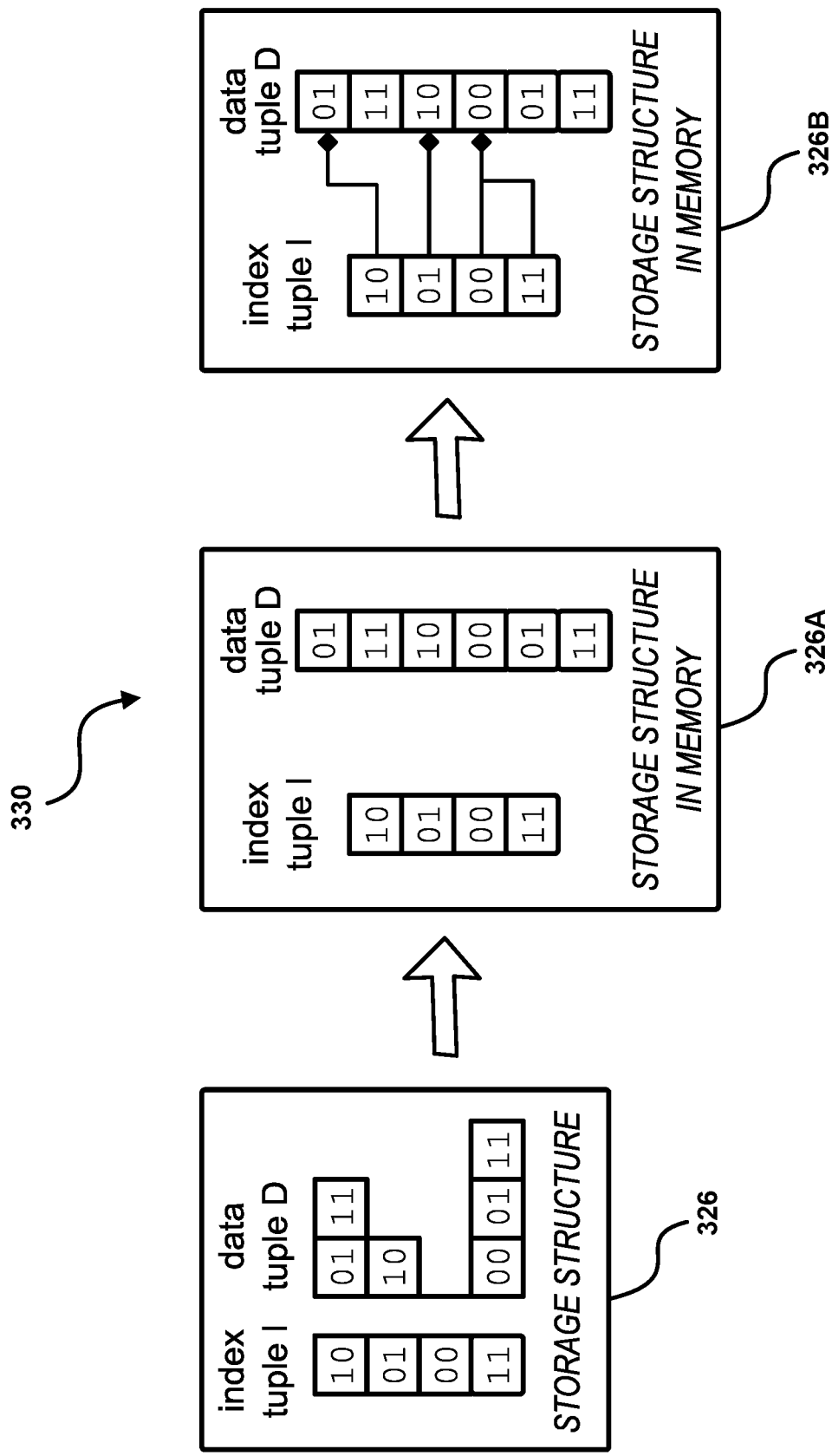

The block index tuple I and the block data tuple D are stored for example in a storage structure 200 described herein with reference to FIG. 2. The block index tuple is represented by an index block 222 shown extending vertically, each element thereof (e.g., $I_1, I_2, I_3, \ldots I_N$) including a quantity or null value of the corresponding index part. The block data tuple is represented by a plurality of data blocks 224A, 224B, 224C, . . . and 224N. Sub-elements (e.g., $D_1^1$, $D_1^2$, $D_1^3$, . . . , $D_1^{I_1}$) in a particular data block (e.g., data block 224A) are data parts of the corresponding index part of the index tuple I (e.g., $I_1$), and the number of such sub-elements is equal to the corresponding index part (e.g., $I_1$).

In the data decompression method 120, an index tuple I and a data tuple D are accessed (step 122). Each element of the block index tuple I is assigned its index from the <0, 1, . . . , $2^{B_A}$−1> range (step 124). The assignment of the indices in step 124 is performed sequentially. Alternatively, the assignment of the indices can be performed non-sequentially based on particular criteria. Each index is paired with the sub-elements, if any, of the respective element of block data tuple D to reassemble the original integers (step 126). The respective index (i.e., from <0, 1, . . . , $2^{B_A}$−1> is the first part of the reconstructed integer, and the sub-element of the block data tuple D is the second part.

The methods 100, 120 are applicable to sorted and unsorted integers. The method 100 works with unsorted integers as if they are a sorted collection of unique integers, and the original order of the integers and possible duplicate values of the integers are not preserved. However, it can be determined whether a particular integer is present in a collection of unsorted integers compressed as described herein, and actions such as add, remove, and modify can be performed on the compressed collection of unsorted integers as if they were a collection of sorted integers.

The size $B_I$ of elements in the block index tuple I is independent of other herein described values and can be chosen according to a use-case scenario. The size $B_I$ determines the maximum number $K_B^{max}$ of integers from the set M which can fall into a respective block determined by $B_A$. The size $S_I$ of the block index tuple I is $S_I=B_I*2^{B_A}$, as $2^{B_A}$ elements of size $B_I$ are stored. The size $S_D$ of the block data tuple D is $S_D=B_D*K$, as K elements of size $B_D$ are stored.

Referring to FIG. 2, the storage structure 200 is provided for data compression as a tuple C=(I, D, $B_A$, $B_I$, $B_D$) where:

I=($I_1, \ldots , I_N$) is the block index tuple, where N=$2^{B_A}$;
D=($D_1, \ldots , D_N$) is the block data tuple, where $D_i=(D_i^1, \ldots , D_i^{I_i})$, i.e., |$D_i$|=$I_i$;
$B_A$ is the index part bit size;
$B_I$ is an index tuple element (i.e., $I_i$) bit size; and
$B_D$ is the data part bit size which is the data tuple sub-element (i.e., $D_i^j$) bit size.

The serialized size of the storage structure 200 is $S_C=S_I+S_D$ as only the block index tuple I and the block data tuple D grow with the number of items stored. The index part bit size $B_A$, the index tuple element bit size $B_I$, and the data tuple element bit size $B_D$ can either be derived from the used data types, or their storage takes negligible memory.

Properties of the storage structure 200 for data compression in the form of C=(I, D, $B_A$, $B_I$, $B_D$) are described with reference to Equations 1 through 5 in which the number of stored integers is K. The compressed size of the storage structure 200 is:

$$S_C=S_I+S_D=B_I*2^{B_A}+B_D*K \qquad \text{Eq. 1}$$

The average number of sub-elements in a data tuple block are:

$$K_B^{avg}=K/2^{B_A} \qquad \text{Eq. 2}$$

The maximum number of sub-elements in a data tuple block are:

$$K_B^{max}=2^{B_I}-1 \qquad \text{Eq. 3}$$

The maximum number of stored integers are:

$$K^{max}=2^{B_A}*(2^{B_I}-1) \qquad \text{Eq. 4}$$

The minimum number of stored integers K for the storage structure 200 to have a compression ratio >1.0 is:

$$K^{min}>(2^{B_A}*B_I)/B_A \qquad \text{Eq. 5}$$

The compressed size $S_C$ of the set M of K integers is less than S if the set cardinality K is at least (≥) $K^{min}$, and if the set cardinality K is at most (≤) $K^{max}$, and if the integers are uniformly distributed over their value space (defined by bit size B) so that their number in every value space block (defined by index part bit size $B_A$) is at most ($\leq$) $K_B^{max}$.

Referring to FIGS. 1B and 2, the storage structure 200 in the form of C=(I, D, $B_A$, $B_I$, $B_D$) is decompressed in the decompression method 120 by sequentially assigning each element of the block index tuple I (in index block 222) its index from the <0, 1, ..., $2^{B_A}$−1> range, and then pairing each element of the index with the sub-elements, if any, of the respective element of block data tuple D (e.g., in each of the data blocks 224A, 224B, 224C, 224N) to put together the original integers. The respective index element is the first part of the reconstructed number, and the sub-element of the block data tuple D is the second part. The element values of the block index tuple I are crucial to actually store the data. The purpose of block index tuple I is to capture the size of each data tuple element. By separating all metadata (e.g., pointers) from the data tuple, content of the data tuple can be efficiently stored in a continuous chunk of memory without added overhead.

Metadata including the size and offsets of tuples in a data tuple are implicit, whereas metadata are explicit in computer data structures. For example, for a tuple T=((0, 1, 2), (1, 2), (1, 1)), implicit metadata includes offsets/indices wherein the first sub-tuple (0, 1, 2) has offset/index 0 (zero), the second sub-tuple (1, 2) has offset/index 1 (one), and the third sub-tuple (1, 1) has offset/index 2 (two). In the example of the tuple T, implicit metadata further includes sizes wherein the first sub-tuple (0, 1, 2) has size 3 (three), the second sub-tuple (1, 2) has size 2 (two), and the third sub-tuple (1, 1) has size 2 (two). Such metadata need to be stored in a particular location in a particular manner in a computer data structure.

Effective compression where the compressed size $S_C$ is less than (<) the total size S of the set M is achieved by:

for each integer from the set M only its data part is stored, which is smaller than the original integer because the data part bit size $B_D$ is less than (<) the integer bit size B; and instead of storing index parts, only the block index tuple I is stored, which is smaller than the index parts because:

the index tuple element bit size $B_I$ is less than or equal to ($\leq$) the index part bit size $B_A$; and $2^{B_A}$ is less than (<) the set cardinality K as there are more integers to store (K integers) than there are elements of the index tuple I ($2^{B_A}$ elements).

Setting the index tuple bit size $B_I$ to be greater than (>) the index part bit size $B_A$ is not beneficial as that would allow elements of the index tuple I to have higher values than there could be integers in the respective block.

Referring to FIGS. 3A-3D, a first exemplary implementation 300 of the storage structure 200 is shown in which six 4-bit unsigned numbers (data set 302) are provided. The six numbers include 1 ($0001_2$ in binary notation), 3 ($0011_2$ in binary notation), 6 ($0110_2$ in binary notation), 12 ($1100_2$ in binary notation), 13 ($1101_2$ in binary notation), 15 ($1111_2$ in binary notation), together totaling 24 bits. The six numbers are encoded into 20 bits by implementing the storage structure 200 for data compression in the form of C=(I, D, $B_A$, $B_I$, $B_D$) where:

I=($10_2$,$01_2$,$00_2$,$11_2$)
D=(($01_2$,$11_2$),($10_2$),( ),($00_2$,$01_2$,$11_2$))
$B_A$=2
$B_I$=2
$B_D$=2

Properties for the first exemplary implementation 300 of the storage structure 200, having K=6 integers and S=6*4=24 bits, in view of Equations 1 through 5 are:

$S_C$=2*$2^2$+2*6=8+12=20 bits
$K_B^{avg}$=6/$2^2$=1.5 sub-elements in a data tuple block
$K_B^{max}$=$2^2$−1=3 sub-elements in a data tuple block
$K^{max}$=$2^2$*($2^2$−1)=12 integers
$K^{min}$>($2^2$*2)/2, $K^{min}$>4 integers A compression process breakdown 320 of the first exemplary implementation 300 of the storage structure 200 is depicted in which the data set 302 is broken down into index parts and data parts. The quantity of each value of the index parts is used to generate an index tuple 322, wherein the quantity of each value of the index parts is located in the index tuple based on respective indices 323. The respective value of each data part is used to generate a data tuple 324, wherein the respective value of each data part is located in the data tuple based on the respective indices 323. The index tuple 322 and the data tuple 324 form a storage structure 326 of compressed data. Referring to a structure consolidation diagram 330 in FIG. 3C, the storage structure 326 is stored in computer memory as shown in storage structures in memory 326A, 326B in which all integers of the block data tuple D are stored in a continuous memory chunk in which the block index tuple I is relied on to capture sizes of elements of the block data tuple D to de-serialize the continuous memory chunk.

A decompression process breakdown 340 of the first exemplary implementation 300 of the storage structure 200 is depicted in which the index tuple 322 and the data tuple 324 of the storage structure 326 are decompressed. Each element of the index tuple 322 is sequentially assigned its index from the range <0, 1, 2, 3>, which in binary is <$00_2$, $01_2$, $10_2$, $11_2$>. Each element of the index <$00_2$, $01_2$, $10_2$, $11_2$> is paired with the sub-elements of the respective element of the data tuple 324. An index element (e.g., $00_2$) is the first part of the reconstructed number, and the sub-element (e.g., $01_2$) of the respective element (e.g., $01_2$, $11_2$) of the data tuple 324 is the second part of the reconstructed number (e.g., $0001_2$).

Referring to FIG. 4, a second exemplary implementation 400 of the storage structure 200 is shown resulting in an overflow. In the second exemplary implementation 400, four 4-bit unsigned numbers including 12 ($1100_2$ in binary notation), 13 ($1101_2$ in binary notation), 14 ($1110_2$ in binary notation), and 15 ($1111_2$ in binary notation) are provided. As in the first exemplary implementation 300, $B_A$=2, $B_I$=2, and $B_D$=2 in the compression tuple C=(I, D, $B_A$, $B_I$, $B_D$). However, in the second exemplary implementation 400, compression ends up in an overflow 402 because not all of the four integers from the block with index part 112 are able to be counted. There are four integers ($K_B$=4), but because the index tuple element bit size $B_I$=2, the exemplary implementation allows counting only up to three integers as indicated by $K_B^{max}$=3. The condition that $K_B$ is at most ($\leq$) $K_B^{max}$ is therefore not met.

The first and second exemplary implementations 300, 400 of the storage structure 200 demonstrate the principles of the illustrative embodiments in an understandable manner, but much larger sets of integers of greater bit size are compressible by the storage structure 200. In a third exemplary implementation of the storage structure 200, a tuple C=(I, D, 32, 8, 32) is used to store billions of 64-bit hashes (a set of elements of cardinality K) and has properties per Equations 3 through 5 of:

$K_B^{max}$=$2^8$−1=255 sub-elements in a data tuple block;
$K^{max}$=$23^2$($2^8$−1)≅1095 billion integers; and
$K^{min}$>($2^{32}$*8)/32, $K^{min}$>1.074 billion integers.

For a tuple C=(I, D, 32, 8, 32) used to store 10 billion 64-bit integers (K=10 billion and S=10^10*64=640 billion uncompressed bits), properties per Equations 1 and 2 are:

$S_C=8*2^{32}+32*10^{10} \cong 354$ billion bits (compression ratio$\cong$640/354$\cong$1.81); and $K_B^{avg}=10^{10}/2^{32} \cong 2.33$ sub-elements in a data tuple block.

Although in the third exemplary implementation both the set cardinality K and the average number of sub-elements $K_B^{avg}$ in a data tuple block of the data tuple block are well below their respective theoretical maximums of $K^{max}$ and $K_B^{max}$, and therefore there is still significant room to store more elements (i.e., integers) in the storage structure 200, it is beneficial not to approach $K^{max}$ too closely. In a scenario where $K_B^{avg}$ comes near $K_B^{max}$ the probability of just one of the $2^{32}$ data tuple blocks of the third exemplary implementation having a sub-element count above $K_B^{max}$ rises. The storage structure further relies on the input numbers being uniformly distributed to reduce the possibility of having a sub-element count greater than $K_B^{max}$.

Figure 5:
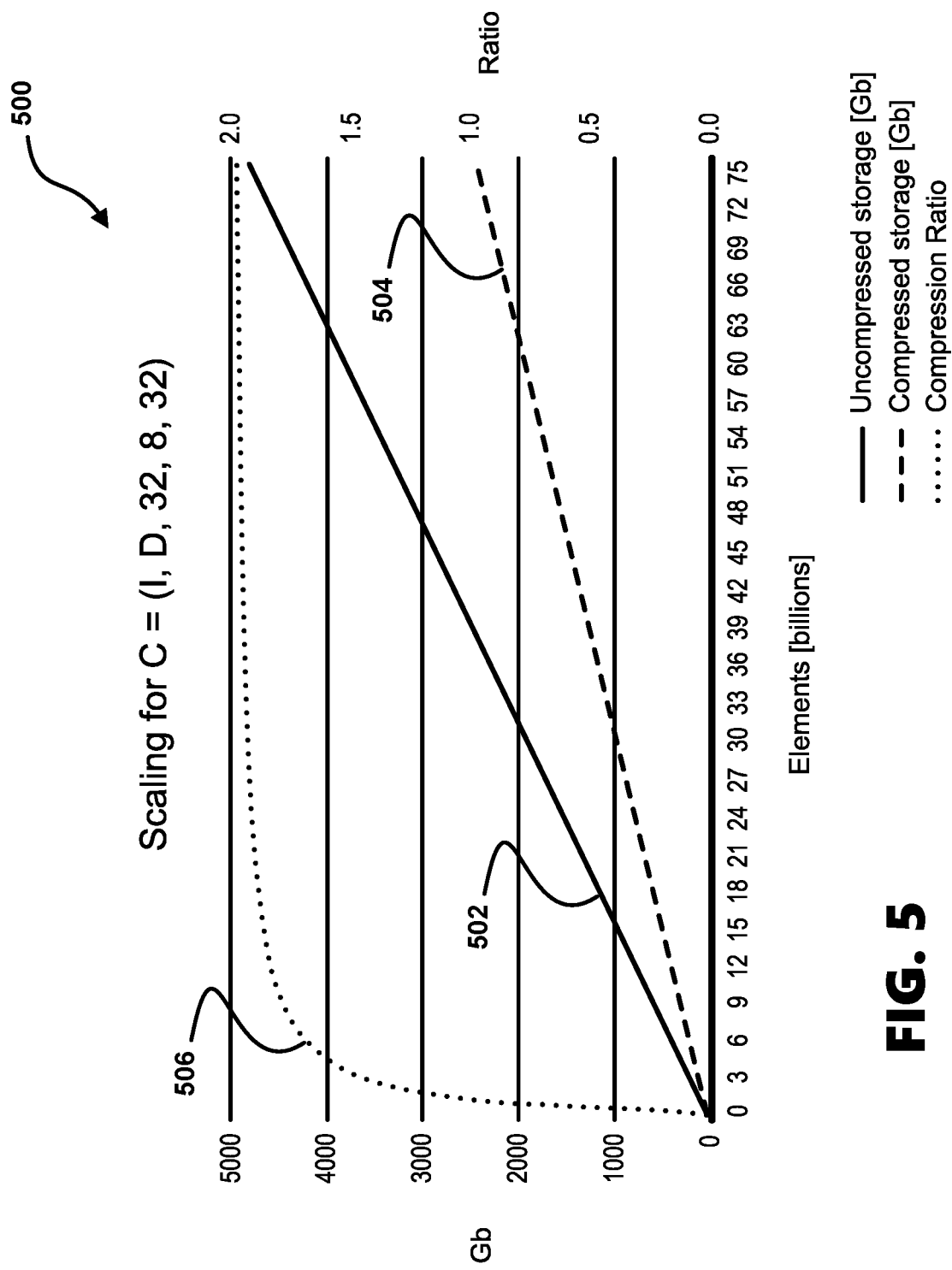
FIGS. 5 and 6 are properties diagrams showing properties of further exemplary implementations of the storage structure of FIG. 2.

Referring to FIG. 5, a properties diagram 500 shows properties of the storage structure 200 for the tuple C=(I, D, 32, 8, 32) for a set of elements of cardinality K ranging from 0 (zero) to 75 (seventy-five) billion 64-bit integers. The properties include uncompressed storage 502 in gigabits, compressed storage 504 in gigabits, and compression ratio 506.

In a fourth exemplary implementation of the storage structure 200, a tuple C=(I, D, 32, 8, 48) is used to store billions of 80-bit integers and has properties per Equations 3 through 5 of:

$K_B^{max}=2^8-1=255$ sub-elements in a data tuple block;

$K^{max}=2^{32}*(2^8-1) \cong 1095$ billion integers; and $K^{min}>(2^{32}*8)/32$, $K^{min}>1.074$ billion integers.

For a tuple C=(I, D, 32, 8,48) used to store 10 billion 64-bit integers (K=10 billion [$10^{10}$] and S=$10^{10}$*64=640 billion uncompressed bits), properties per Equations 1 and 2 are:

$S_C=8*2^{32}+48*10^{10} \cong 514.4$ billion bits (compression ratio$\cong$640/514.4$\cong$1.24); and $K_B^{avg}=10^{10}/2^{32} \cong 2.33$ sub-elements in a data tuple block.

Values for $K_B^{max}$, $K^{max}$, and $K^{min}$ are the same in the third and fourth exemplary implementations because the index part bit size $B_A$ and the index tuple element bit size $B_I$ are the same. Larger data parts, corresponding to the data tuple element bit size $B_D$, are stored in the fourth exemplary implementation as compared to the third exemplary implementation. Since more bits in the data part are stored, the fourth exemplary implementation scales differently than the third exemplary implementation scaled. The storage structure 200 in the form of C=(I, D, $B_A$, $B_I$, $B_D$) is configurable and other values for the bit sizes $B_A$, $B_I$, $B_D$ can be selected to optimize efficiencies based on the expected number of stored integers K.

Figure 6:
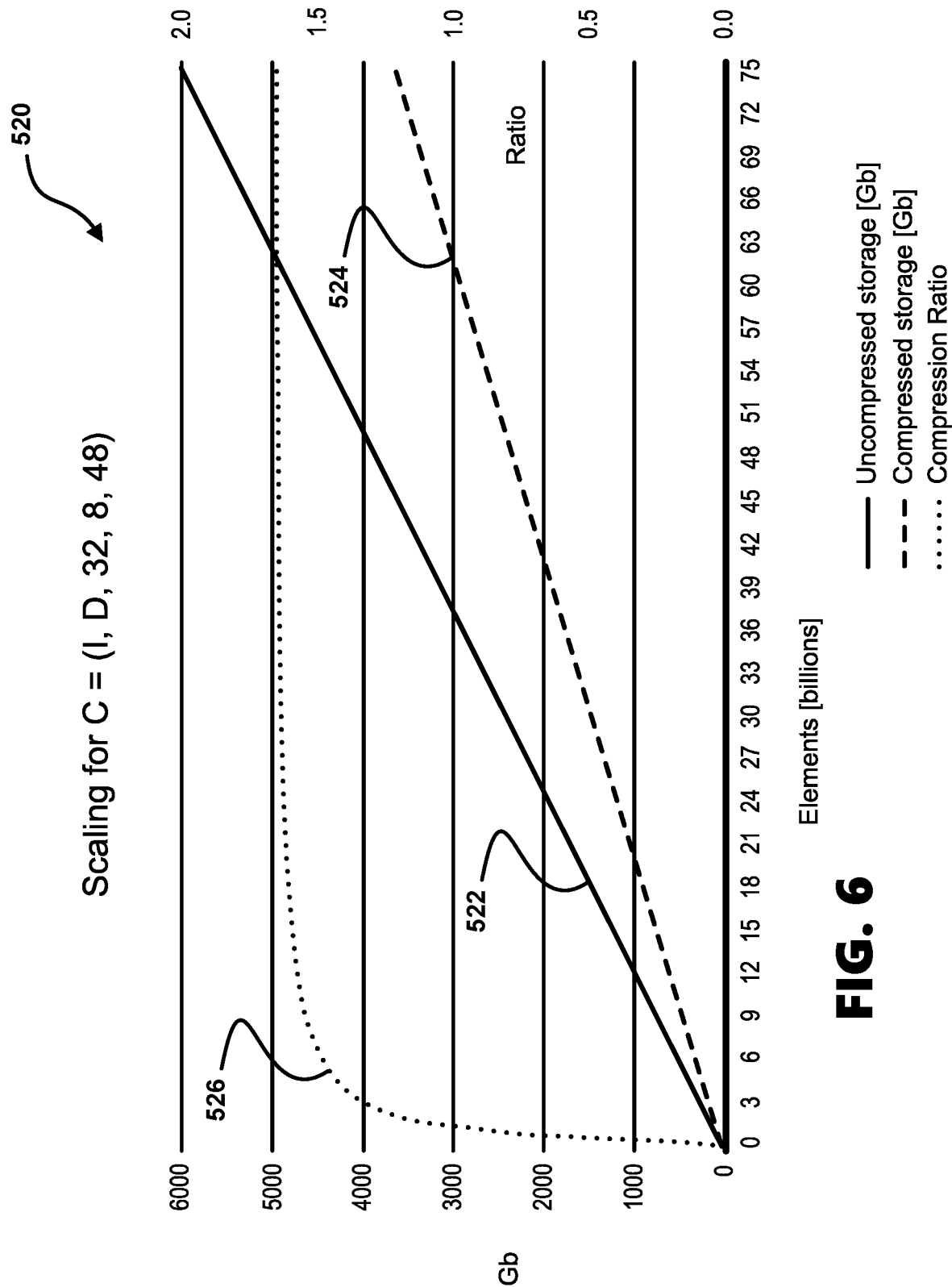

Referring to FIG. 6, a properties diagram 520 shows properties for the tuple C=(I, D, 32, 8, 48) for a set of elements of cardinality K ranging from 0 (zero) to 75 (seventy-five) billion 80-bit integers. Properties include uncompressed storage 522 in gigabits, compressed storage 524 in gigabits, and compression ratio 526.

The data storage structure 200 can be optimized by setting different $B_A$, $B_I$, $B_D$ values for the data properties and volumes desired to be stored. The storage structure 200 can accordingly be used in different scenarios. The storage structure 200 can be efficiently yet manageably implemented using a hierarchical structure with very little overhead (e.g., for pointers), keeping the real storage requirements close to the theoretical values. Not only can compression ratio >1.0 be achieved using the storage structure 200, but also the ability to rapidly query the stored values can be maintained.

As described herein, the data storage structure 200 enables storage of a compressed set of generally uniformly distributed integers. The storage structure 200 can be optimized for the profile of data to be stored. It is possible to quickly query the compressed data for the presence of any value in the set of integers. The storage structure 200 is configurable-input data with different properties can be stored in differently configured storages and therefore achieve the best compression ratio. Further, the storage structure 200 can be implemented with very little memory overhead, maintaining the advantage of performing the compression.

Figure 7:
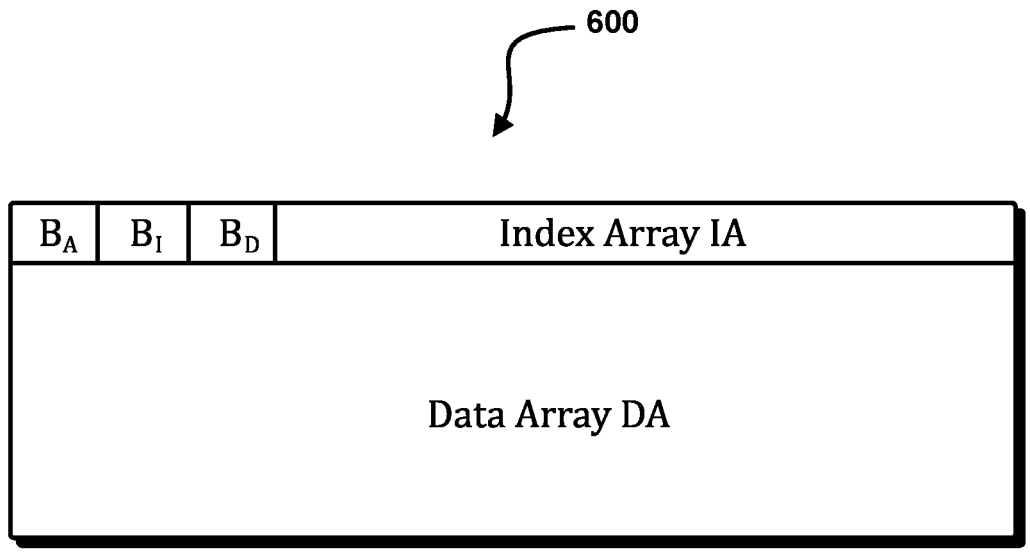
FIG. 7 is a file format schema based on the storage structure of FIG. 2 showing a file format for data storage on computer-readable media.

Referring to FIG. 7, in view of the herein described processes and the storage structure 200 based on the tuple C=(I, D, $B_A$, $B_I$, $B_D$), a file format for data storage on computer-readable media is defined with a file format schema 600 where:

$B_A$ specifies the index part bit size;

$B_I$ specifies the bit size of elements in the index array;

$B_D$ specifies the bit size of elements of the data array;

IA is an index array of the serialized block index tuple I; and

DA is a data array of the serialized block data tuple D.

Beneficially, $B_A$, $B_I$, and $B_D$ each have one byte. Alternatively, any byte size is acceptable. Using the storage structure 200 in the form of the tuple C=(I, D, $B_A$, $B_I$, $B_D$) and the file format schema 600, storage operations including insert, remove, and query can be specified. As described herein, an array access operator [N] and an array slice operator [M:N] are used for both the index array IA and data array DA. The array access operator used in IA[j] denotes access to j-th element of the index array IA. The array slice operator IA[i:j] denotes that all elements IA[k], for i≤k<j are accessed.

Figure 8:
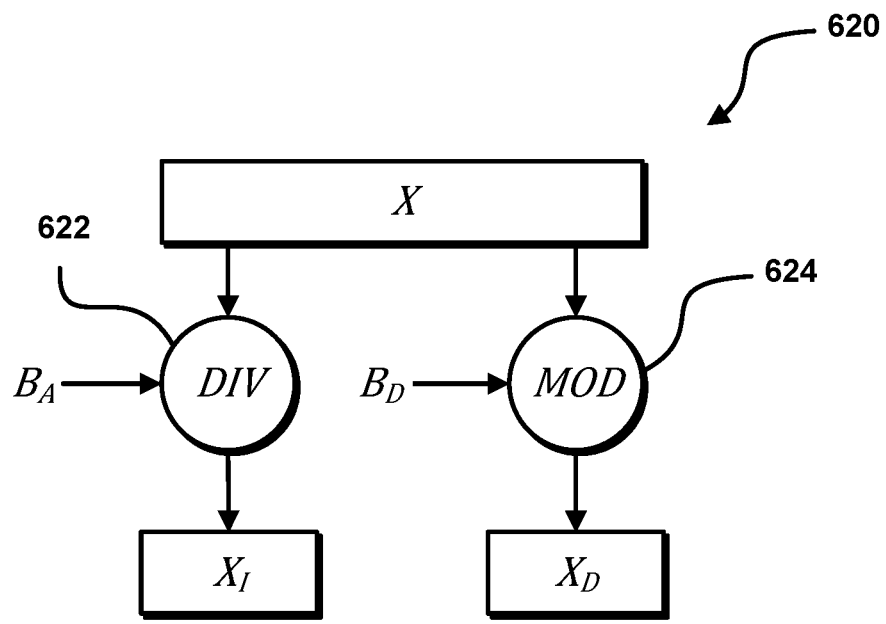
FIG. 8 is a diagram showing an integer splitting process for implementing the storage structure of FIG. 2.

Integer splitting is used in generating the index array IA and the data array DA from a set of integers. Integer splitting is a manner of splitting an integer into a storage part and an address part. Referring to FIG. 8, an integer splitting process is depicted by a first schema 620 for splitting an integer X into an index part $X_I$ of the index array IA and a data part $X_D$ of the data array DA. Integer X division $B_A$ (step 622) returns index part $X_I$, and integer X modulo $B_D$ returns data part $X_D$ (step 624).

An index reduction process computes a relevant offset O (letter "O") to the data array from the index part $X_I$. Functionally, the index reduction can be expressed from the index part $X_I$ as:

$$idxreduce(0) = 0; \text{ and} \qquad \text{Eq. 6}$$

$$idxreduce(X_I) = \sum_{i=0}^{X_I-1} IA[i]; \forall X_I > 0 \qquad \text{Eq. 7}$$

This expressions of equation 6 and equation 7 denote the sum of all elements in an index tuple (up until an index). For example, for an index tuple I=(3, 10, 4, 15):

idxreduce(0)=0;

idxreduce(1)=3;

idxreduce(2)=13; and idxreduce(3)=17

Offset O (letter "O") is used to access a data array that is one continuous array of integers. The example index tuple I=(3, 10, 4, 15) corresponds to:
- a first tuple (0) that starts on offset 0 and has size 3;
- a second tuple (1) that starts on offset 3 and has size 10;
- a third tuple (2) that starts on offset 13 and has size 4; and
- a last tuple (3) that starts on offset 17 and has size 15.

Figure 9:
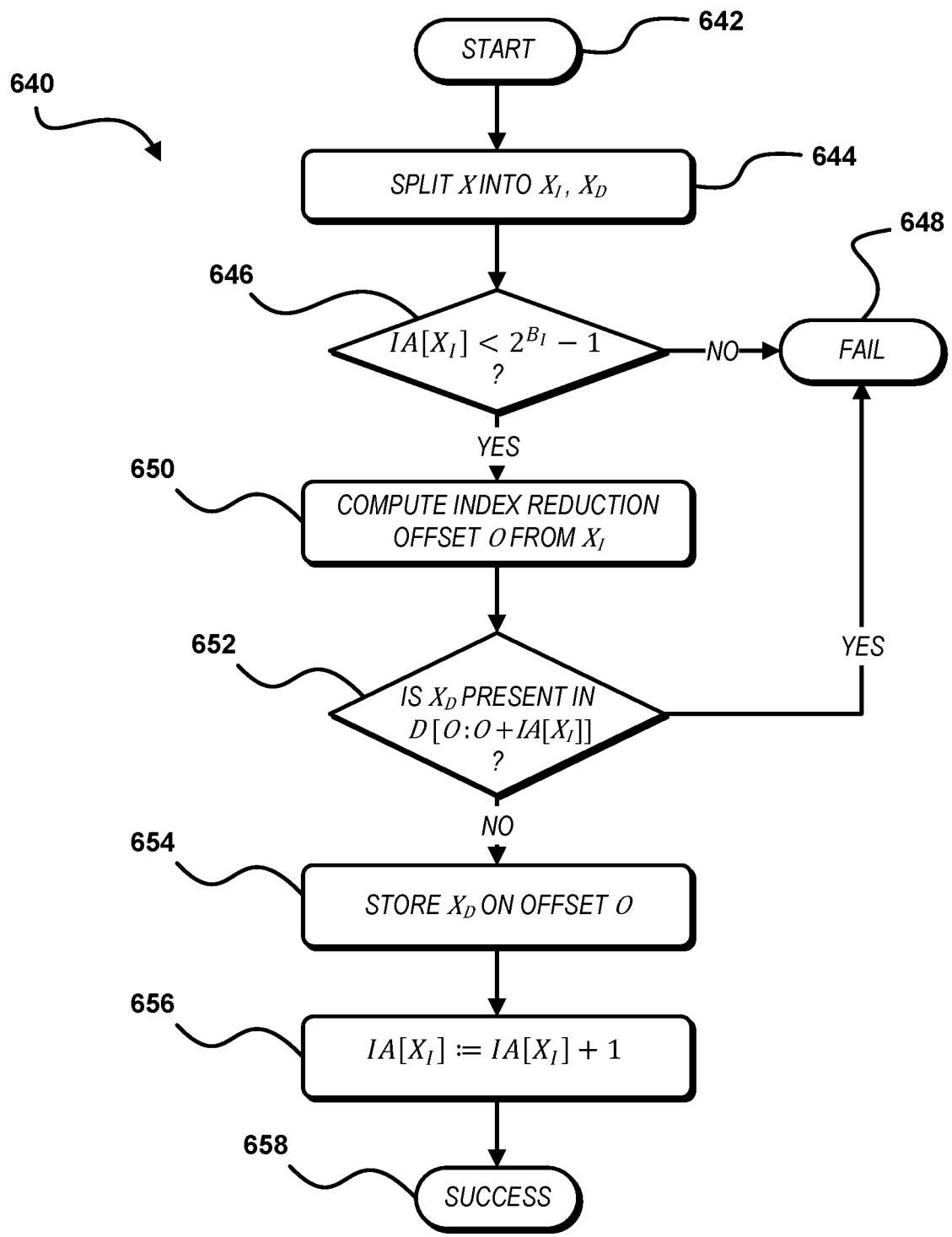
FIG. 9 is a diagram showing an insertion operation for inserting an integer into storage enabled by the file format schema of FIG. 7.

Referring to FIG. 9, an insertion operation 640 is shown for inserting the integer X into the storage enabled by the file format schema 600 for the storage structure 200 in the form of C=(I, D, $B_A$, $B_I$, $B_D$). The insertion operation 640 starts at step 642. An integer X is split into an index part $X_I$ and a data part $X_D$ (step 644). It is determined in step 646 whether IA[$X_I$] is less than (<) $2^{B_I}-1$. If it is determined in step 646 that IA[$X_I$] is not less than (<) $2^{B_I}-1$, then the insertion operation 640 fails in step 648. If it is determined in step 646 that IA[$X_I$] is less than (<) $2^{B_I}-1$, then in step 650 an index reduction offset O (letter "O") is computed from the index part $X_I$.

It is determined in step 652 whether the data part $X_D$ is present in D[O:O+IA[$X_I$]]. This expression D[O:O+IA[$X_I$]] denotes the accessing of a data tuple that is on offset O and that has the size IA[$X_I$]. In other words, IA[$X_I$] elements are taken from the data array starting at offset O. If in step 652 the data part $X_D$ is determined to be present in D[O:O+IA[$X_I$]], then the insertion operation 640 fails in step 648. If the data part $X_D$ is determined not to be present in D[O:O+IA[$X_I$]], then the data part $X_D$ is stored on the offset O (step 654), and IA[$X_I$] is defined to be equal to IA[$X_I$]+1 (step 656) resulting in success at step 658.

Figure 10:
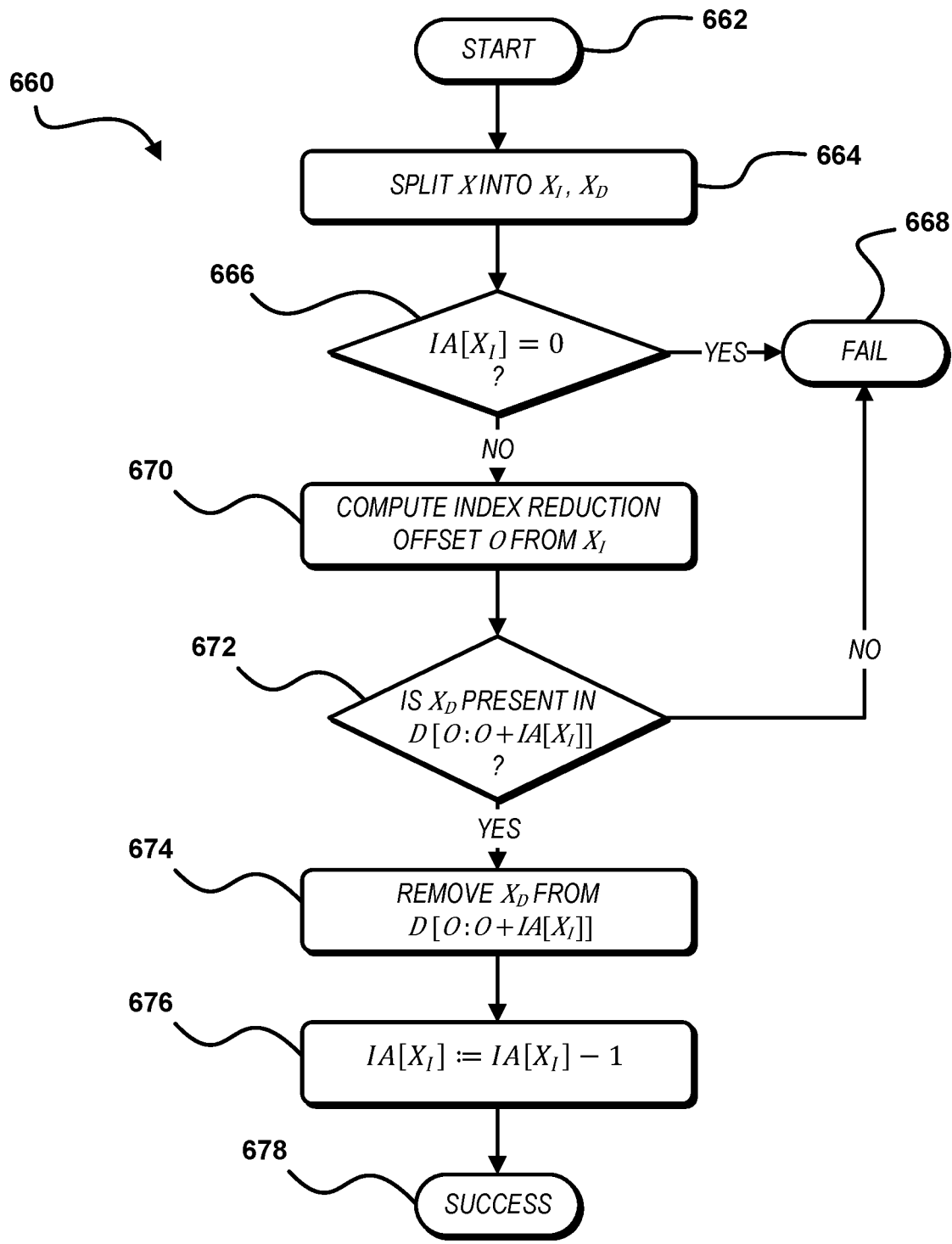
FIG. 10 is a diagram showing a removal operation for removing an integer from storage enabled by the file format schema of FIG. 7.

Referring to FIG. 10, a removal operation 660 is shown for removing the integer X from the storage enabled by the file format schema 600 for the storage structure 200 in the form of C=(I, D, $B_A$, $B_I$, $B_D$). The removal operation 660 starts at step 662. An integer X is split into an index part $X_I$ and a data part $X_D$ (step 664). It is determined in step 666 whether IA[$X_I$] is equal to 0 (zero). If it is determined in step 666 that IA[$X_I$] is equal to 0 (zero), then the removal operation 660 fails in step 668. If it is determined in step 666 that IA[$X_I$] is not equal to 0 (zero), then in step 670 an index reduction offset O is computed from the index part $X_I$.

It is determined in step 672 whether the data part $X_D$ is present in D[O:O+IA[$X_I$]]. If in step 672 the data part $X_D$ is determined not to be present in DO: 0+IA[$X_I$], then the removal operation 660 fails in step 668. If the data part $X_D$ is determined to be present in D[O:O+IA[$X_I$]], then the data part $X_D$ is removed from D[O:O+IA[$X_I$]] (step 674), and IA[$X_I$] is defined to be equal to IA[$X_I$]-1 (step 676) resulting in success at step 678.

Figure 11:
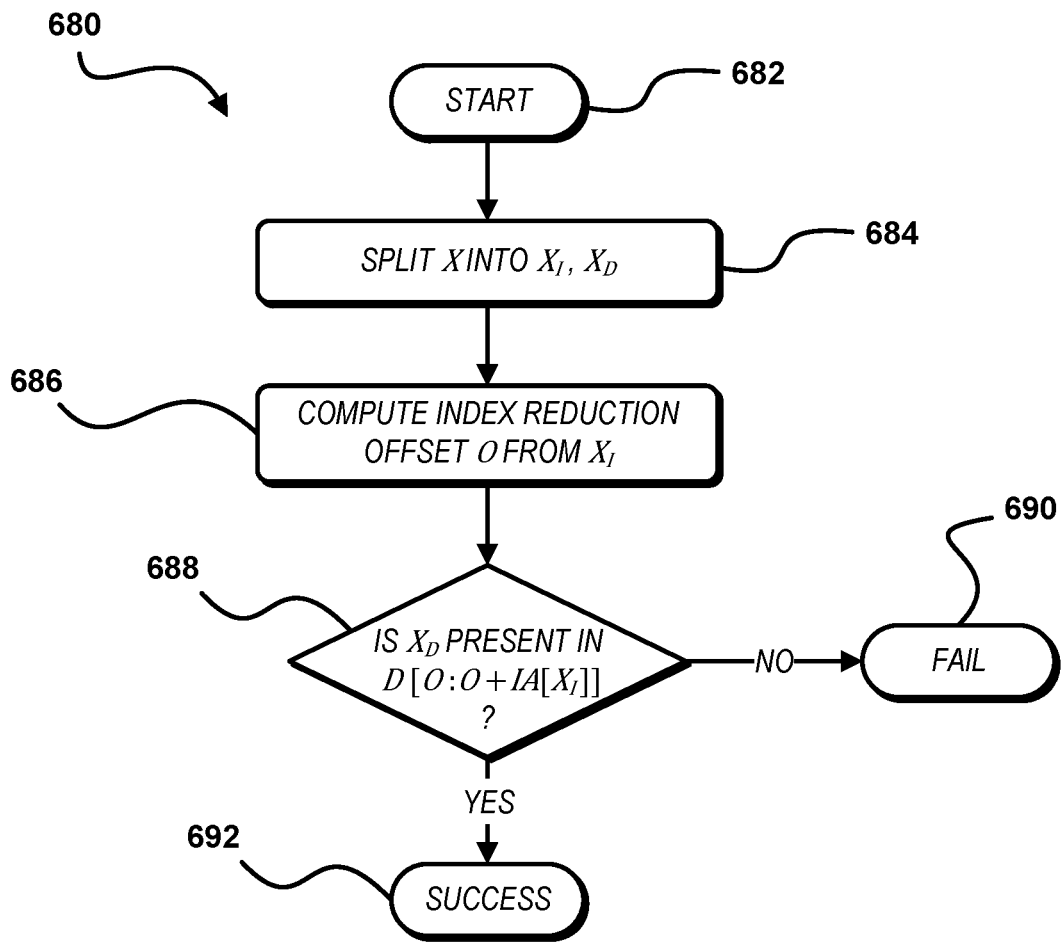
FIG. 11 is a diagram showing a querying operation for querying the presence of an integer in storage enabled by the file format schema of FIG. 7.

Referring to FIG. 11, a querying operation 680 is shown for querying the presence of the integer X in the storage enabled by the file format schema 600 for the storage structure 200 in the form of C=(I, D, $B_A$, $B_I$, $B_D$). The querying operation 680 starts at step 682. An integer X is split into an index part $X_I$ and a data part $X_D$ (step 684). In step 686 an index reduction offset O is computed from the index part $X_I$. It is determined in step 688 whether the data part $X_D$ is present in D[O:O+IA[$X_I$]]. If in step 688 the data part $X_D$ is determined not to be present in D[O:O+IA[$X_I$]], then the query operation 680 fails to determine the presence of the integer X in step 690. If the data part $X_D$ is determined to be present in D[O:O+IA[$X_I$]], denoting presence of the integer X, success results in step 692.

The storage structure enabled by the file format schema 600 can be enhanced by implementing distributed storage. Inefficiencies may be present in the operations 640, 660, 680 because the index reduction process is in a worst-case scenario summing all elements of a very large index. This problem can, however, be solved by distributing the index. Instead of working with the index as one array, the array can be split into multiple uniform-sized subarrays herein called "chunks". With smaller chunks to work with, one or more benefits can be achieved, for example:
- performing all storage operations more efficiently;
- loading whole storage into random access memory ("RAM");
- selectively loading only parts of the storage into RAM; and
- distributing responsibility for parts of the storage into multiple computers.

Figure 12A:
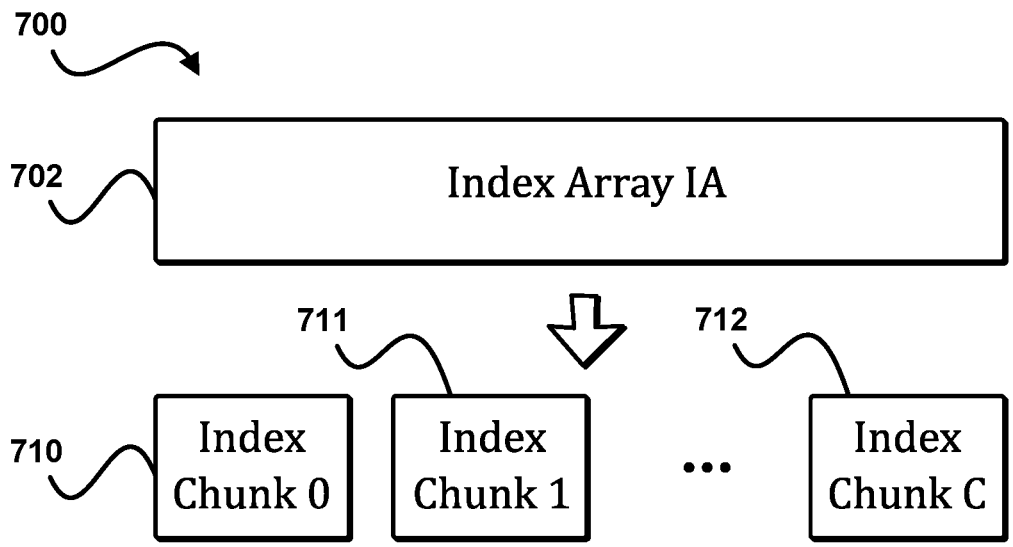
FIG. 12A is an index distribution model showing an index array distributed into index chunks to enable distributed storage for the file format schema of FIG. 7.

Referring to FIG. 12A, an index distribution model 700 shows the index array IA (block 702) distributed into an index chunk "0" 710, an index chunk "1" 711, . . . and an index chunk "C" 712. A problem that arises is that even though the index array IA can be divided into chunks in a straightforward manner, the data array DA cannot as easily be divided into chunks as the data array DA includes subparts varying in size. To divide the data array DA into corresponding chunks it is necessary to pre-compute index reductions for each index chunk to reference the start of corresponding data in the data array DA. This is a one-time operation, and once completed, precomputed data and the storage can be worked with in a very efficient manner.

Figure 12B:
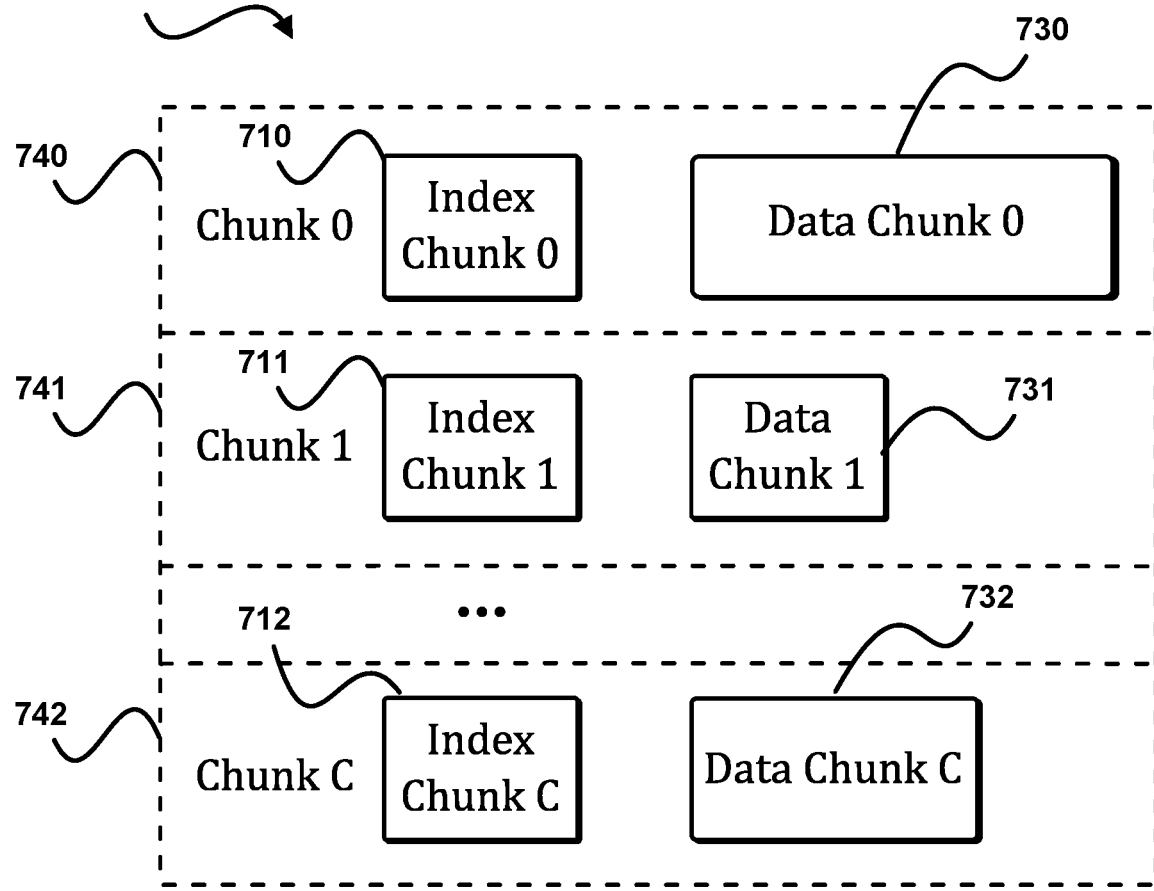
FIG. 12B is a data distribution model showing the index chunks of FIG. 12A respectively grouped with data chunks formed by division of a data array.

With pre-computed indices of data chunks, the original storage can be viewed as many sub-storages with the same properties as the original storage. The advantage of this is that each part can be worked with separately, which is more time efficient. Referring to FIGS. 12A and 12B, a data distribution model 720 shows the index array IA (block 702) distributed into the index chunk "0" 710, the index chunk "1" 711, . . . and the index chunk "C" 712 respectively grouped with a data chunk "0" 730, a data chunk "1" 731, . . . and a data chunk "C" 732, formed by division of the data array DA, in a chunk "0" 740, a chunk "1" 741, and a chunk "C" 742.

Information about the chunks needs to be stored somewhere. Chunk referencing can be implemented for example with integer offsets for loading from computer-readable media, with pointers to memory arrays, or most efficiently, by using arrays of arrays. Methods employing integer offsets for loading from computer-readable media or employing pointers to memory arrays require storing more metadata which consumes relatively more storage space. A method using arrays of arrays processing consumes relatively less storage space, in comparison to a pointers implementation, and is capable of having the same space requirements as the computer-readable media storage structure. The implementation of arrays does not add any memory overhead, and the structure itself only stores a continuous chunk of elements without any metadata. Arrays do not add pointers (like lists), or any other metadata (e.g., sizes). So, the size of data in an implementation of arrays is the same as described herein (e.g., with reference to tuples). And since the only needed metadata is stored as an index tuple I (i.e., as an index array IA) which represent sizes of sub-arrays in a data array DA, these metadata are also considered in the overall memory calculations as described herein. However, having a lot of dynamic subarrays by implementing arrays of arrays processing leads to memory fragmentation over time and requires continuous maintenance of the storage.

Figure 13:
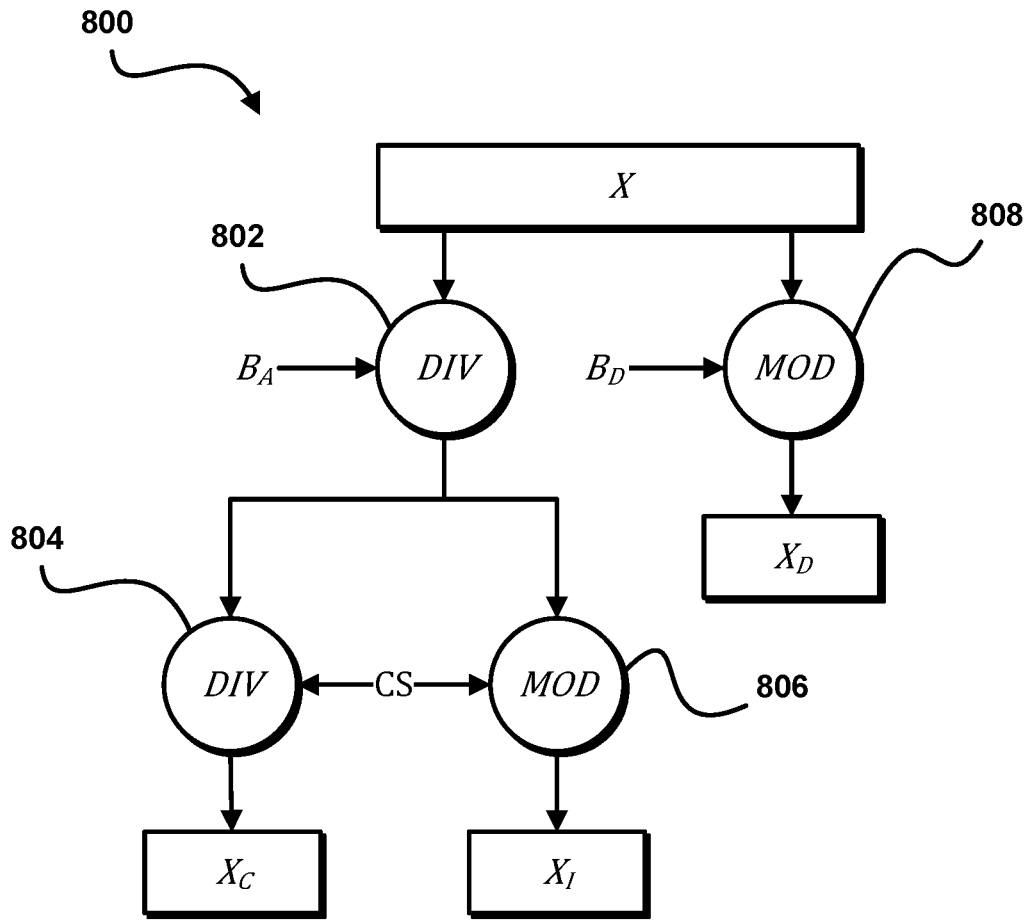
FIG. 13 is a diagram showing an alternative integer splitting process for implementing the storage structure of FIG. 2 for models employing chunks.

Referring to FIG. 13, when using chunks, it is beneficial to implement an alternative integer splitting process as shown in a second schema 800 for splitting an integer X into an index part $X_I$ of the index array IA, a data part $X_D$ of the data array DA, and a chunk part $X_C$. Apart from the index part $X_I$ and the data part $X_D$ it is necessary to compute the chunk part $X_C$ based on a chosen chunk bit size CS. In storage operations, the chunk part $X_C$ references a specific chunk containing part of the index array and part of the data array that are used instead of the original index array and original data array. Integer X division $B_A$ (step 802) division chunk bit size CS (step 804) returns chunk part $X_C$. Integer X division $B_A$ (step 802) modulo chunk bit size CS (step 806) returns index part $X_I$. Integer X modulo $B_D$ returns data part $X_D$ (step 808).

Figure 14:
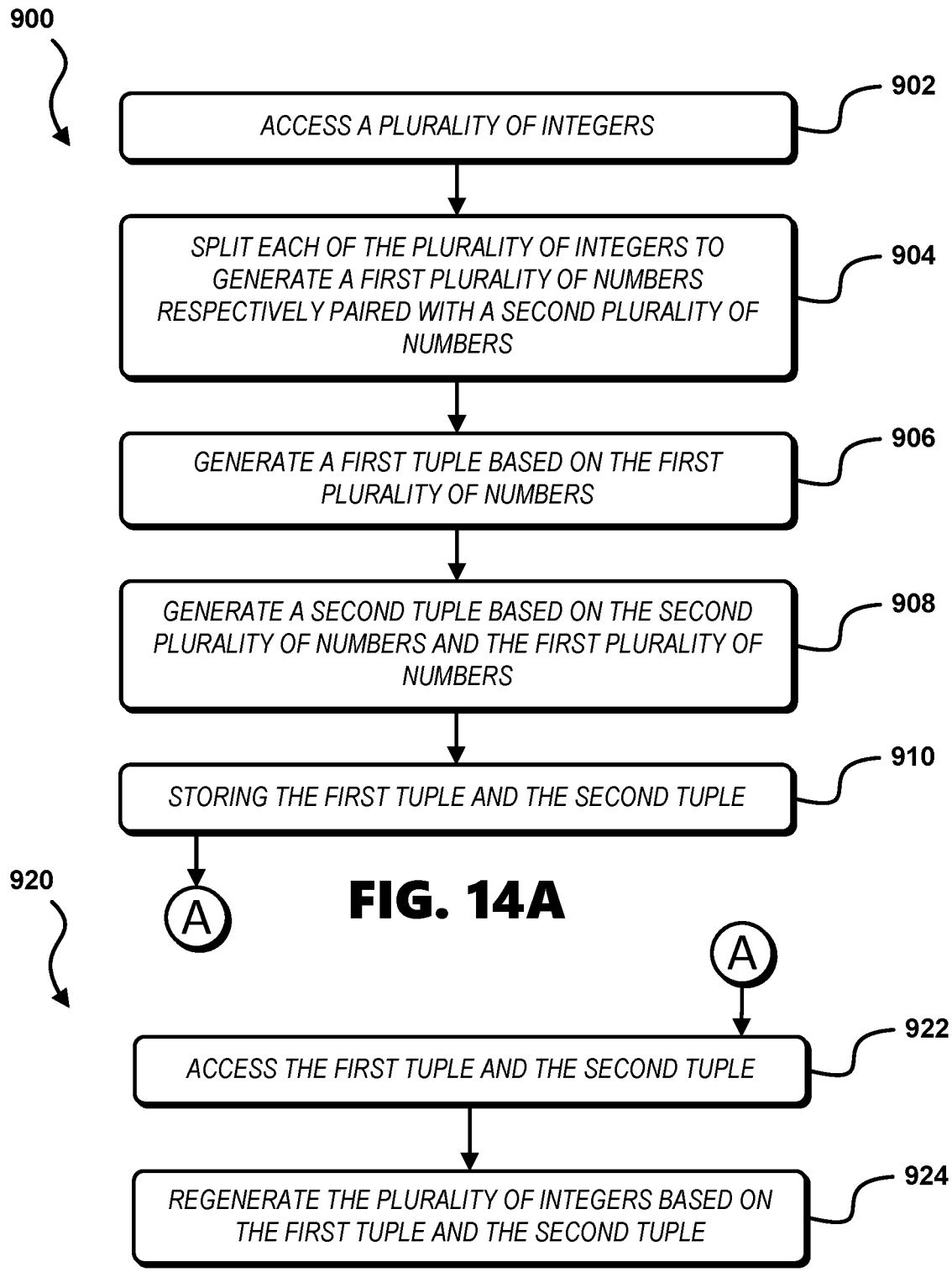
FIG. 14A is a diagram showing a data processing method in the form of a data compression method.
FIG. 14B is a diagram showing a data processing method in the form of a data decompression method.

Referring to FIG. 14A, a first data processing method 900 in the form of a data compression method is shown. In a step 902, a plurality of integers are accessed. Each of the plurality of integers is split to generate a first plurality of numbers respectively paired with a second plurality of numbers (step 904). A first tuple is generated based on the first plurality of numbers (step 906) A second tuple is generated based on the second plurality of numbers and the first plurality of numbers (step 908). The first tuple and the second tuple are stored (step 910).

Referring to FIG. 14B, a second data processing method 920 in the form of a data decompression method continues from step 910 of the first data processing method 900 at a connector "A". The second data processing method 920 includes accessing the first tuple and the second tuple (step 922) and regenerating the plurality of integers based on the first tuple and the second tuple (step 924).

Figure 15:
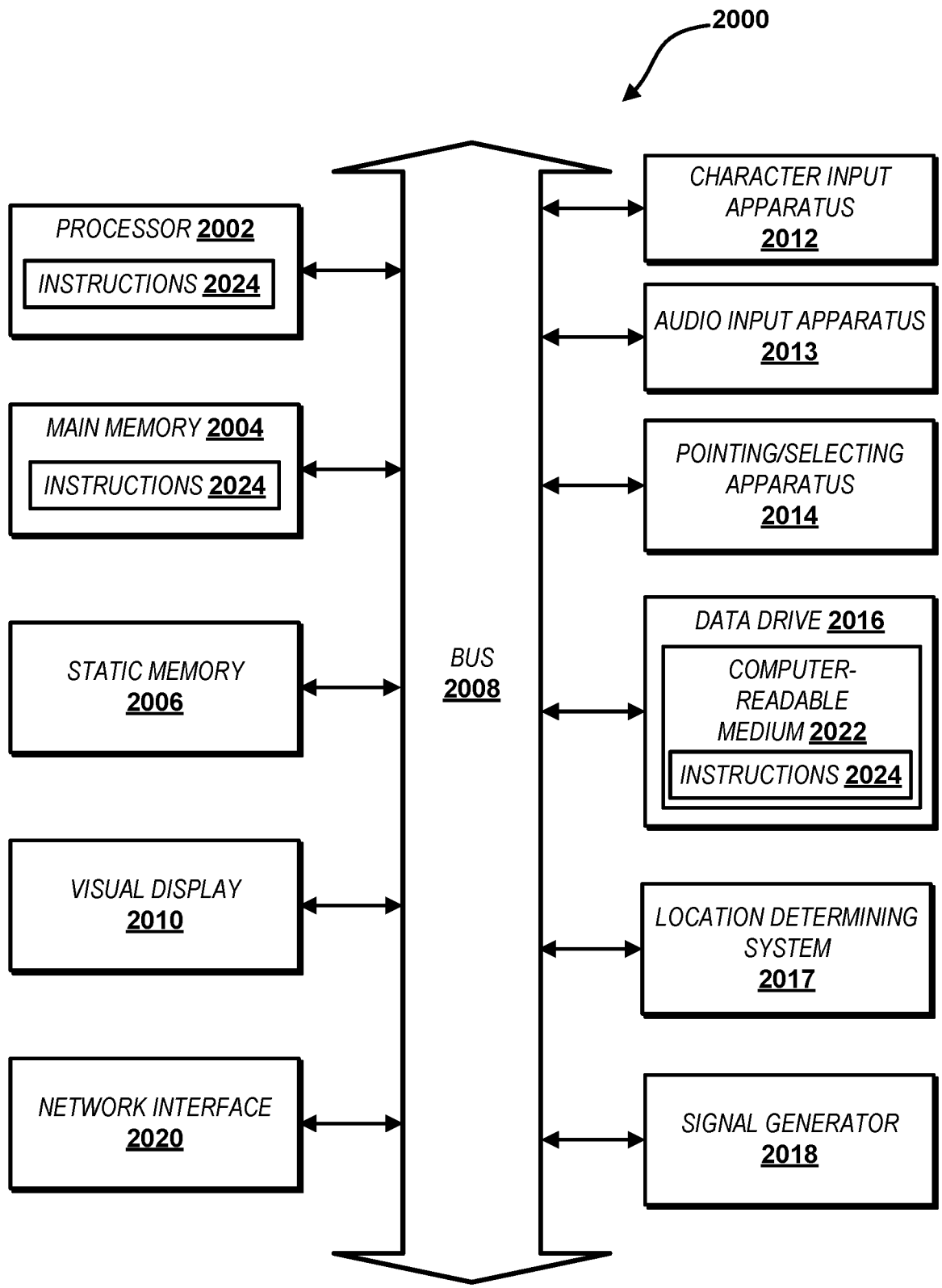
FIG. 15 shows a computer system for performing described methods according to illustrative embodiments.

FIG. 15 illustrates in abstract the function of an exemplary computer system 2000 on which the systems, methods and processes described herein can execute. The computer system 2000 may be provided in the form of a personal computer, laptop, handheld mobile communication device, mainframe, distributed computing system, or other suitable configuration. Illustrative subject matter is in some instances described herein as computer-executable instructions, for example in the form of program modules, which program modules can include programs, routines, objects, data structures, components, or architecture configured to perform particular tasks or implement particular abstract data types. The computer-executable instructions are represented for example by instructions 2024 executable by the computer system 2000.

The computer system 2000 can operate as a standalone device or can be connected (e.g., networked) to other machines. In a networked deployment, the computer system 2000 may operate in the capacity of a server or a client machine in a server-client network environment, or as a peer machine in a peer-to-peer (or distributed) network environment. The computer system 2000 can also be considered to include a collection of machines that individually or jointly execute a set (or multiple sets) of instructions to perform one or more of the methodologies described herein, for example in a cloud computing environment.

It would be understood by those skilled in the art that other computer systems including but not limited to networkable personal computers, minicomputers, mainframe computers, handheld mobile communication devices, multiprocessor systems, microprocessor-based or programmable electronics, and smart phones could be used to enable the systems, methods and processes described herein. Such computer systems can moreover be configured as distributed computer environments where program modules are enabled and tasks are performed by processing devices linked through a computer network, and in which program modules can be located in both local and remote memory storage devices.

The exemplary computer system 2000 includes a processor 2002, for example a central processing unit (CPU) or a graphics processing unit (GPU), a main memory 2004, and a static memory 2006 in communication via a bus 2008. A visual display 2010 for example a liquid crystal display (LCD), light emitting diode (LED) display, or a cathode ray tube (CRT) is provided for displaying data to a user of the computer system 2000. The visual display 2010 can be enabled to receive data input from a user for example via a resistive or capacitive touch screen. A character input apparatus 2012 can be provided for example in the form of a physical keyboard, or alternatively, a program module which enables a user-interactive simulated keyboard on the visual display 2010 and actuatable for example using a resistive or capacitive touchscreen. An audio input apparatus 2013, for example a microphone, enables audible language input which can be converted to textual input by the processor 2002 via the instructions 2024. A pointing/selecting apparatus 2014 can be provided, for example in the form of a computer mouse or enabled via a resistive or capacitive touch screen in the visual display 2010. A data drive 2016, a signal generator 2018 such as an audio speaker, and a network interface 2020 can also be provided. A location determining system 2017 is also provided which can include for example a GPS receiver and supporting hardware.

The instructions 2024 and data structures embodying or used by the herein-described systems, methods, and processes, for example software instructions, are stored on a computer-readable medium 2022 and are accessible via the data drive 2016. Further, the instructions 2024 can completely or partially reside for a particular time period in the main memory 2004 or within the processor 2002 when the instructions 2024 are executed. The main memory 2004 and the processor 2002 are also as such considered computer-readable media.

While the computer-readable medium 2022 is shown as a single medium, the computer-readable medium 2022 can be considered to include a single medium or multiple media, for example in a centralized or distributed database, or associated caches and servers, that store the instructions 2024. The computer-readable medium 2022 can be considered to include any tangible medium that can store, encode, or carry instructions for execution by a machine and that cause the machine to perform any one or more of the methodologies described herein, or that can store, encode, or carry data structures used by or associated with such instructions. Further, the term "computer-readable storage medium" can be considered to include, but is not limited to, solid-state memories and optical and magnetic media that can store information in a non-transitory manner. Computer-readable media can for example include non-volatile memory such as semiconductor memory devices (e.g., magnetic disks such as internal hard disks and removable disks, magneto-optical disks, CD-ROM and DVD-ROM disks, Erasable Programmable Read-Only Memory (EPROM), Electrically Erasable Programmable Read-Only Memory (EEPROM), and flash memory devices).

The instructions 2024 can be transmitted or received over a computer network using a signal transmission medium via the network interface 2020 operating under one or more known transfer protocols, for example FTP, HTTP, or HTTPs. Examples of computer networks include a local area network (LAN), a wide area network (WAN), the internet, mobile telephone networks, Plain Old Telephone (POTS) networks, and wireless data networks, for example Wi-Fi™ and 3G/4G/5G cellular networks. The term "computer-readable signal medium" can be considered to include any transitory intangible medium that is capable of storing, encoding, or carrying instructions for execution by a machine, and includes digital or analog communications signals or other intangible medium to facilitate communication of such instructions.

Although features and elements are described above in particular combinations, one of ordinary skill in the art will appreciate that each feature or element can be used alone or in any combination with the other features and elements. Methods described herein may be implemented in a computer program, software, or firmware incorporated in a computer-readable medium for execution by a computer or processor.

While embodiments have been described in detail above, these embodiments are non-limiting and should be considered as merely exemplary. Modifications and extensions may be developed, and all such modifications are deemed to be within the scope defined by the appended claims.

What is claimed is:

1. A data compression method comprising:
accessing a plurality of integers of a number (K);
splitting each of the plurality of integers to generate a first plurality of numbers respectively paired with a second plurality of numbers;
comparing a plurality of values over a range to the first plurality of numbers to generate a plurality of quantities;
storing a first tuple including the plurality of quantities, the plurality of quantities respectively ordered as elements of the first tuple based on the respective value represented by each of the plurality of quantities; and
storing a second tuple including the second plurality of numbers in elements of the second tuple, each one of the second plurality of numbers included as a sub-element in a respective element of the second tuple based on the respective one of the first plurality of numbers to which the one of the second plurality of numbers is paired;
wherein the number (K) of the plurality of integers is greater than $(2^{B_A}*B_I)/B_A$, wherein the $B_A$ is equal to a bit size of each of the plurality of values, and wherein the $B_I$ is equal to a bit size of each of the elements of the first tuple, to achieve a sum ($S_C$) of the first tuple and the second tuple which is less than the number (K) of the plurality of integers times a bit size (B) of each of the plurality of integers to achieve a compression ratio greater than 1, wherein the compression ratio is equal to $(K*B)/S_C$.

2. The method of claim 1, wherein:
the number of the elements of the first tuple is equal to the number of the elements of the second tuple; and
each one of the second plurality of numbers is included in the respective element of the second tuple that corresponds to an order in the first tuple of the quantity of the respective one of the first plurality of numbers to which the one of the second plurality of numbers is paired.

3. The method of claim 1, further comprising:
accessing the first tuple and the second tuple; and
assigning the plurality of values respectively to the elements of the second tuple sequentially over the range based on the plurality of quantities to pair each sub-element of the respective element of the second tuple to a respective one of the plurality of values to regenerate the plurality of integers.

4. The method of claim 1, further comprising:
accessing the first tuple and the second tuple; and
assigning the plurality of values respectively to the elements of the second tuple over the range based on the plurality of quantities to pair each sub-element of the respective element of the second tuple to a respective one of the plurality of values to regenerate the plurality of integers.

5. The method of claim 1, further comprising:
accessing the first tuple and the second tuple;
assigning the plurality of values respectively to the elements of the first tuple over the range; and
assigning the plurality of values respectively to the elements of the second tuple over the range based on the plurality of quantities to pair each sub-element of the respective element of the second tuple to a respective one of the plurality of values to regenerate the plurality of integers.

6. The method of claim 1, further comprising:
accessing the first tuple and the second tuple;
sequentially assigning the plurality of values respectively to the elements of the first tuple over the range; and
sequentially assigning the plurality of values respectively to the elements of the second tuple over the range based on the plurality of quantities to pair each sub-element of the respective element of the second tuple to a respective one of the plurality of values to regenerate the plurality of integers.

7. The method of claim 1, wherein a bit size of each of the plurality of values is equal to a bit size of each of the first plurality of numbers, and the number of the plurality of values is based on the bit size of each of the plurality of values.

8. The method of claim 7, wherein the bit size of each of the first plurality of numbers is equal to a bit size of each of the second plurality of numbers.

9. The method of claim 7, wherein:
the plurality of integers comprise binary data words; and
the number of the plurality of values is equal to $2^{B_A}$.

10. The method of claim 7, wherein the range comprises all values from 0 (zero) to $2^{B_A}-1$.

11. The method of claim 7, further comprising:
accessing the first tuple and the second tuple; and
assigning the plurality of values respectively to the elements of the second tuple over the range based on the plurality of quantities to pair each sub-element of the respective element of the second tuple to a respective one of the plurality of values to regenerate the plurality of integers.

12. The method of claim 1, wherein the plurality of integers each comprise a binary data word having at least 8 bits.

13. The method of claim 1, wherein:
a bit size of each of the first plurality of numbers is equal to a bit size of each of the second plurality of numbers; and
the number of the plurality of values is based on the bit size of each of the plurality of values.

14. The method of claim 13, further comprising:
accessing the first tuple and the second tuple; and
assigning the plurality of values respectively to the elements of the second tuple over the range based on the plurality of quantities to pair each sub-element of the respective element of the second tuple to a respective one of the plurality of values to regenerate the plurality of integers.

15. A data compression method comprising:
accessing a plurality of integers of a number (K);
splitting each of the plurality of integers to generate a first plurality of numbers respectively paired with a second plurality of numbers;
determining a quantity of each value of a plurality of values represented by the first plurality of numbers to generate a plurality of quantities;
storing a first tuple including the plurality of quantities, the plurality of quantities respectively ordered as elements of the first tuple based on the respective value represented by each of the plurality of quantities; and
storing a second tuple including the second plurality of numbers in elements of the second tuple, each one of the second plurality of numbers included as a sub-element in a respective element of the second tuple based on an order in the first tuple of the quantity of the respective one of the first plurality of numbers to which the one of the second plurality of numbers is paired;
wherein the number (K) of the plurality of integers is greater than $(2^{B_A} * B_I)/B_A$, wherein the $B_A$ is equal to a bit size of each of the plurality of values, and wherein the $B_I$ is equal to a bit size of each of the elements of the first tuple, to achieve a sum ($S_C$) of the first tuple and the second tuple which is less than the number (K) of the plurality of integers times a bit size (B) of each of the plurality of integers to achieve a compression ratio greater than 1, wherein the compression ratio is equal to $(K*B)/S_C$.

16. The method of claim 15, further comprising:
accessing the first tuple and the second tuple; and
assigning the plurality of values respectively to the elements of the second tuple over a range based on the plurality of quantities to pair each sub-element of the respective element of the second tuple to a respective one of the plurality of values to regenerate the plurality of integers.

17. The method of claim 1, further comprising:
accessing the first tuple and the second tuple; and
regenerating the plurality of integers based on the first tuple and the second tuple.

18. A system for data compression, comprising:
one or more processors; and
memory storing executable instructions that, as a result of being executed, cause the system to perform operations comprising:
accessing a plurality of integers of a number (K);
splitting each of the plurality of integers to generate a first plurality of numbers respectively paired with a second plurality of numbers;
providing a plurality of values over a range;
comparing the plurality of values to the first plurality of numbers to determine for each of the plurality of values a quantity of matches in the first plurality of numbers to generate a plurality of quantities;
storing a first tuple including the plurality of quantities, the plurality of quantities respectively ordered as elements of the first tuple based on the respective value represented by each of the plurality of quantities; and
storing a second tuple including the second plurality of numbers in elements of the second tuple, wherein each one of the second plurality of numbers is inserted as a sub-element in a respective element of the second tuple based on the respective one of the first plurality of numbers to which the one of the second plurality of numbers is paired;
wherein the number (K) of the plurality of integers is greater than $(2^{B_A} * B_I)/B_A$, wherein the $B_A$ is equal to a bit size of each of the plurality of values, and wherein the $B_I$ is equal to a bit size of each of the elements of the first tuple, to achieve a sum ($S_C$) of the first tuple and the second tuple which is less than the number (K) of the plurality of integers times a bit size (B) of each of the plurality of integers to achieve a compression ratio greater than 1, wherein the compression ratio is equal to $(K*B)/S_C$.

19. A non-transitory computer-readable storage medium storing executable instructions that, as a result of execution by one or more processors of a computer system, cause the computer system to perform operations comprising:
accessing a plurality of integers of a number (K);
splitting each of the plurality of integers to generate a first plurality of numbers respectively paired with a second plurality of numbers;
determining a quantity of each value of a plurality of values represented by the first plurality of numbers to generate a plurality of quantities;
storing a first tuple including the plurality of quantities, the plurality of quantities respectively ordered as elements of the first tuple based on the respective value represented by each of the plurality of quantities; and
storing a second tuple including the second plurality of numbers in elements of the second tuple, each one of the second plurality of numbers included in a respective element of the second tuple based on an order in the first tuple of the quantity of the respective one of the first plurality of numbers to which the one of the second plurality of numbers is paired;
wherein the number (K) of the plurality of integers is greater than $(2^{B_A} * B_I)/B_A$, wherein the $B_A$ is equal to a bit size of each of the plurality of values, and wherein the $B_I$ is equal to a bit size of each of the elements of the first tuple, to achieve a sum ($S_C$) of the first tuple and the second tuple which is less than the number (K) of the plurality of integers times a bit size (B) of each of the plurality of integers to achieve a compression ratio greater than 1, wherein the compression ratio is equal to $(K*B)/S_C$.

20. A data compression method comprising:
accessing a plurality of integers of a number (K);
performing a compression of the plurality of integers, the performing the compression comprising:
splitting each of the plurality of integers to generate a first plurality of numbers respectively paired with a second plurality of numbers;
comparing a plurality of values over a range to the first plurality of numbers to generate a plurality of quantities;
storing as a data structure in a memory a first tuple including the plurality of quantities, the plurality of quantities respectively ordered as elements of the first tuple based on the respective value represented by each of the plurality of quantities; and
storing as the data structure in the memory a second tuple including the second plurality of numbers in elements of the second tuple, each one of the second plurality of numbers included as a sub-element in a respective element of the second tuple based on the respective one of the first plurality of numbers to which the one of the second plurality of numbers is paired; and
wherein the number (K) of the plurality of integers is greater than $(2^{B_A} * B_I)/B_A$, wherein the $B_A$ is equal to a bit size of each of the plurality of values, and wherein the $B_I$ is equal to a bit size of each of the elements of the first tuple, to achieve a sum ($S_C$) of the first tuple and the second tuple which is less than the number (K) of the plurality of integers times a bit size (B) of each of the plurality of integers to achieve a compression ratio greater than 1, wherein the compression ratio is equal to $(K*B)/S_C$.

21. The data compression method of claim 20, further comprising:

accessing the first tuple and the second tuple; and performing a decompression of the data structure in the memory, the performing the decompression comprising:

assigning the plurality of values respectively to the elements of the second tuple sequentially over the range based on the plurality of quantities to pair each sub-element of the respective element of the second tuple to a respective one of the plurality of values to regenerate the plurality of integers.

\* \* \* \* \*

UNITED STATES PATENT AND TRADEMARK OFFICE
CERTIFICATE OF CORRECTION

PATENT NO. : 12,147,396 B2
APPLICATION NO. : 17/569071
DATED : November 19, 2024
INVENTOR(S) : Peter Kubov and Peter Matula Page 1 of 1

It is certified that error appears in the above-identified patent and that said Letters Patent is hereby corrected as shown below:

In the Specification

At Column 3, at Line 39, after "-1", delete ")" and insert therefor -- > --.

At Column 5, at Line 58, after "15", delete "($1111_2$" and insert therefor -- ($1111_2$ --.

At Column 8, at Line 58, Equation 7, delete "$idxreduce(X_l) = \sum_{i=0}^{X_l-1} IA[i]; \forall X_l > 0$," and insert therefor --$idxreduce(X_l) = \sum_{i=0}^{X_l-1} IA[i] \ ; \forall X_l > 0$--.

At Column 9, at Line 44, after "in", delete "DO: 0+IA[$X_l$]]" and insert therefor -- D[O:O+IA[$X_l$]] --.

Signed and Sealed this
Fourth Day of February, 2025

Coke Morgan Stewart
*Acting Director of the United States Patent and Trademark Office*